(12) United States Patent
Katoh et al.

(10) Patent No.: US 8,094,481 B2
(45) Date of Patent: Jan. 10, 2012

(54) RESISTANCE VARIABLE MEMORY APPARATUS

(75) Inventors: Yoshikazu Katoh, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 363 days.

(21) Appl. No.: 12/529,103

(22) PCT Filed: Mar. 12, 2008

(86) PCT No.: PCT/JP2008/000542
§ 371 (c)(1),
(2), (4) Date: Aug. 28, 2009

(87) PCT Pub. No.: WO2008/129774
PCT Pub. Date: Oct. 30, 2008

(65) Prior Publication Data
US 2010/0110767 A1      May 6, 2010

(30) Foreign Application Priority Data

Mar. 13, 2007   (JP) ................................. 2007-063155

(51) Int. Cl.
*G11C 11/00* (2006.01)
(52) U.S. Cl. .................. 365/148; 365/100; 365/163
(58) Field of Classification Search .................. 365/148, 365/100, 163
See application file for complete search history.

(56) References Cited

U.S. PATENT DOCUMENTS

| 7,916,556 B2* | 3/2011 | Kitagawa et al. | 365/189.15 |
| 7,920,402 B2* | 4/2011 | Katoh et al. | 365/100 |
| 7,978,539 B2* | 7/2011 | Lee et al. | 365/189.15 |
| 2004/0264244 A1 | 12/2004 | Morimoto | |
| 2010/0202185 A1* | 8/2010 | Katoh et al. | 365/148 |

FOREIGN PATENT DOCUMENTS

| JP | 2004-185756 | 7/2004 |
| JP | 2005-025914 | 1/2005 |
| WO | WO 2006/137111 A1 | 12/2006 |
| WO | WO 2007/046145 A1 | 4/2007 |
| WO | WO 2007/074504 A1 | 7/2007 |

OTHER PUBLICATIONS

Baek, I.G., et al., "Highly Scalable Non-volatile Resistive Memory using Simple Binary Oxide Driven by Asymmetric Unipolar Voltage Pulses", 2004, IEEE.

* cited by examiner

*Primary Examiner* — Anh Phung
(74) *Attorney, Agent, or Firm* — McDermott Will & Emery LLP

(57) ABSTRACT

A resistance variable memory apparatus (10) of the present invention comprises a resistance variable element (1) which is switched to a high-resistance state when a voltage exceeds a first voltage and is switched to a low-resistance state when the voltage exceeds a second voltage, a controller (4), a voltage restricting active element (2) which is connected in series with the resistance variable element (1); and a current restricting active element which is connected in series with the resistance variable element (1) via the voltage restricting active element (2), and the controller (4) is configured to control the current restricting active element (3) so that a product of a current and a first resistance value becomes a first voltage or larger and to control the voltage restricting active element (2) so that the voltage between electrodes becomes smaller than a second voltage when the element is switched to the high-resistance state, while the controller (4) is configured to control the current restricting active element (3) so that an absolute value of a product of the current and the second resistance value becomes the second voltage or larger and an absolute value of a product of the current and the first resistance value becomes smaller than the first voltage, when the element is switched to the low-resistance state.

13 Claims, 22 Drawing Sheets

RESISTANCE VARIABLE MEMORY APPARATUS

RELATED APPLICATIONS

This application is the U.S. National Phase under 35 U.S.C. §371 of International Application No. PCT/JP2008/000542, filed on Mar. 12, 2008, which in turn claims the benefit of Japanese Application No. 2007-063155, filed on Mar. 13, 2007, the disclosures of which Applications are incorporated by reference herein.

TECHNICAL FIELD

The present invention relates to a resistance variable memory apparatus. More particularly, the present invention relates to a resistance variable memory apparatus using a resistance variable element which is switchable to a high-resistance state and to a low-resistance state in response to applied electric pulses which are identical in polarity and are different in voltage level.

BACKGROUND ART

Nonvolatile memory apparatuses are widely used to be built into a variety of portable hardware such as cellular phones and digital cameras, and their uses have been spreading at a high pace. In recent years, in many occasions, audio data or image data have been used, and hence there has been a strong demand for nonvolatile memory apparatuses which have a larger capacity and are operable at a higher speed. Besides, in fields of nonvolatile memory apparatuses for use with portable hardware, there has been a further demand for lower electric power consumption.

At present, a major nonvolatile memory apparatus is a flash memory. The flash memory is adapted to store data by controlling electric charges accumulated on a floating gate. It is pointed out that the flash memory has a problem that, since the flash memory has a structure in which the electric charges are accumulated in a high electric field on the floating gate, there is a limitation in reduction of its size and it is difficult to achieve miniaturization which is required to achieve a larger capacity. In addition, in the flash memory, specified blocks must be erased all at once without fail to rewrite data, and a programming time is long. Because of such properties, in the flash memory, a very long time is needed to rewrite data and there is a limitation in an increase in a speed.

As a nonvolatile memory apparatus in next generation which can solve these problems, there is a nonvolatile memory apparatus using a resistance variable element which is adapted to store data according to a change in its electric resistance. As the nonvolatile memory using a resistance variable element which is currently proposed, there are MRAM (Magnetic RAM), PRAM (Phase-Change RAM), ReRAM (Resistive RAM), etc.

Patent document 1 discloses an example of a control method of a ReRAM element using an oxide having a perovskite structure. Hereinafter, the control method of the ReRAM element will be described with reference to the drawings.

FIGS. 25 to 27 are views showing the control method of memory cells disclosed in Patent document 1. A memory cell 19 includes a resistance variable element 11 and a selection transistor 12. One terminal of the resistance variable element 11 and one main terminal (drain or source) of the selection transistor 12 are connected to each other. The other main terminal (source or drain) of the selection transistor 12 is connected to a source line terminal 13 by a source line 16. The other terminal of the resistance variable element 11 is connected to a bit line terminal 15 by a bit line 18. The gate of the selection transistor 12 is connected to a word line terminal 14 by a word line 17. In any cases where data is written ("1" is written), data is erased ("0" is written), and data is read, an ON-voltage at a high level is applied to the word line terminal 14 of the selected memory cell, causing the selection transistor 12 to be placed in an electrically-conductive state.

FIG. 25 is a view showing a state where an electric pulse is applied when a write operation is performed in the memory cell of Patent document 1. The source line 16 is set to 0V (electrically grounded). A positive write pulse having a predetermined write voltage amplitude is applied to the bit line 18 and desired data is written to the resistance variable element 11. In a case where multi-valued data is written to the resistance variable element 11, the voltage amplitude of the write pulse is set to a level according to the value of data to be written. For example, in a case where four-valued data is written to one resistance variable element 11, one voltage amplitude is selected from among specified four voltage amplitudes determined according to the respective values of the write data and a write operation is performed. As a write pulse width, a proper width according to the element is selected. That is, to switch the element to a predetermined resistance state, there exist one voltage amplitude level and one pulse width corresponding to the predetermined resistance state.

FIG. 26 is a view showing a state where an electric pulse is applied when an erase operation is performed in the memory cell of Patent document 1. The bit line is set to 0V (electrically grounded), and the source line is applied with a positive erase pulse having a predetermined erase voltage amplitude. In response to the erase pulse applied, the electric resistance of the resistance variable element 11 is caused to have a minimum value. Patent document 1 discloses that when the erase pulse is applied to a specified source line with plural bit lines set to 0V, plural memory cells connected to the plural bit lines and to the source line are erased simultaneously all at once.

FIG. 27 is a view showing a state where an electric pulse is applied when a read operation is performed in the memory cell of Patent document 1. When data stored in the resistance variable element 11 is read, the source line 16 is set to 0V (electrically grounded) and a predetermined read voltage is applied to the selected bit line 18 via a read circuit. Upon the application of the read voltage, a comparator/determiner circuit compares a level of the bit line 18 to a reference level for read, so that the stored data is read.

Non-Patent document 1 discloses a ReRAM element which is switched between the high-resistance state and the low-resistance state in response to applied electric pulses which are identical in polarity and different in voltage and pulse width. In the ReRAM element of Non-Patent document 1, TMO (transition metal oxide) is used as the resistance variable material. The ReRAM element is switchable to the high-resistance state and to the low-resistance state in response to electric pulses which are identical in polarity. FIG. 28 is a view showing a voltage-current characteristic of the ReRAM element of Non-Patent document 1. As shown in FIG. 28, in "SET" in which the ReRAM element is switched from the high-resistance state to the low-resistance state, a more current than before flows when the element has been switched from the high-resistance state to the low-resistance state unless a set current compliance is used. In this case, the ReRAM element is switched again from the low-resistance state to the high-resistance state unexpectedly (incorrect operation), or the element may be broken down due to an excess current. Therefore, it is necessary to use a set current compliance at a predetermined first current value. In "RESET" in which the ReRAM element is switched from the low-resistance state to the high-resistance state, a current is flowed in the ReRAM element at a second current value which is not smaller than the first current value. Unless the absolute value of the voltage applied to the both ends of the resistance variable element is restricted to a value smaller than a certain value after the element has been switched from the low-resistance state to the high-resistance state, an incorrect operation occurs, for example, the resistance state of the element is switched again from the high-resistance state to the low-resistance state unexpectedly.

As described above, for the ReRAM element which is switched to the high-resistance state and to the low-resistance state in response to the applied voltages which are identical in polarity, it is necessary to control a driver circuit for causing the switching of the resistance state so that the first current value or the second current value is selectively used, according to the resistance state of the element. In addition, it is necessary to restrict the voltage applied to the resistance variable element as desired, in the driver circuit.

Patent document 1: Japanese Laid-Open Patent Application Publication No. 2004-185756

Non-Patent document 1: Baek, J. G. et al., 2004, "Highly Scalable Non-volatile Resistive Memory using Simple Binary Oxide Driven by Asymmetric Unipolar Voltage Pulses", TEDM Technical Digest pp. 587-590

DISCLOSURE OF THE INVENTION

Problems to be Solved by the Invention

In a case where the element is switchable between plural resistance states (unipolar-driven) in response to the electric pulses which are identical in polarity in the above mentioned conventional configuration, it is necessary to prevent the incorrect operation or the breakdown of the element. However, such problem is not taken into account in the configuration of Patent document 1.

The present invention has been made to solve the above described problems, and an object of the present invention is to provide a resistance variable memory apparatus which is capable of surely preventing an incorrect operation or breakdown of an element when writing data, with a simple configuration and using a resistance variable element which is switchable between plural resistance states in response to electric pulses which are identical in polarity.

Means for Solving the Problems

With a view to solving the above described problems, the present inventors intensively studied a configuration of the memory apparatus using the resistance variable element and discovered the following.

As a first control method which can be easily presumed, there is a method for writing data in which the resistance state of the element is read once before rewriting and a driver circuit for driving the element using a first current value or smaller is selected if the read resistance state is the high-resistance state, while a driver circuit for driving the element using a current value which is not smaller than a second current value which is larger than the first current value is selected if the read resistance state is the low-resistance state. A severe problem associated with the first control method is that the rewrite operation cannot initiate unless the state of the element is read once without fail, causing a slow write speed.

A second control method in which the data is not read may be possibly used. This method is accomplished such that a voltage is applied to the element to which data is written by a first driver circuit using a set current compliance having a current value smaller than the first current value which is safer than the second current value to switch the element to the low-resistance state once without fail, and thereafter, writing is performed again to the element which is to be switched to the high-resistance state by a second driver providing the second current value, thereby switching the element to the high-resistance state. A problem associated with this control method is that since data is rewritten once without fail to the element which does not need rewriting, rewriting occurs at times more than necessary, causing not only a reduced life of the apparatus but also the slow write speed as in the above control method.

To solve the above described problems, a resistance variable memory apparatus of the present invention comprises a resistance variable element including a first electrode and a second electrode, the resistance variable element being configured to store data based on a change in an electric resistance between electrodes which is an electric resistance between the first electrode and the second electrode; a controller; a voltage restricting active element which is connected in series with the resistance variable element and is configured to set an upper limit of an absolute value of a voltage between electrodes which is an electric potential of the first electrode based on the second electrode as a reference to a predetermined value, in accordance with control of the controller; and a current restricting active element which is connected in series with the resistance variable element via the voltage restricting active element and is configured to set an upper limit of an absolute value of a current between electrodes which is a current flowing between the first electrode and the second electrode to a predetermined value, in accordance with control of the controller; wherein the resistance variable element has a characteristic in which, in a state where the resistance variable element is in a low-resistance state in which the electric resistance between electrodes has a first resistance value, the resistance variable element is switched to a high-resistance state in which the electric resistance between electrodes has a second resistance value larger than the first resistance value when the voltage between electrodes exceeds in absolute value a first voltage, while in a state where the resistance variable element is in the high-resistance state, the resistance variable element is switched from the high-resistance state to the low-resistance state when the voltage between electrodes exceeds in absolute value a second voltage which is identical in polarity to the first voltage and is larger in absolute value than the first voltage.

In such a configuration, it is possible to surely prevent an incorrect operation or breakdown of the element when writing data, with a simple configuration and using the resistance variable element which is switchable between plural resistance states in response to electric pulses which are identical in polarity.

The resistance variable memory apparatus may further comprise: a substrate; a memory array; a column decoder; a row decoder; an electric power supply circuit; a write pulse drive circuit; and a controller; wherein the memory array may include plural bit lines which belong to a first layer formed on the substrate and are formed to extend in parallel with each other; plural word lines which belong to a second layer formed on the substrate and are formed to extend in parallel with each other and to three-dimensionally cross the bit lines as viewed from a direction perpendicular to a main surface of the substrate; and resistance variable elements and voltage restricting active elements which are provided to respectively correspond to positions at which the bit lines and the word lines three-dimensionally cross as viewed from the direction perpendicular to the main surface of the substrate; wherein the voltage restricting active element may be a field effect transistor having a first main terminal, a second main terminal, and a control terminal, the second main terminal is connected to the first electrode, the first main terminal is connected to the bit line, and the control terminal is connected to the word line; wherein the column decoder may be configured to select a specified bit line in accordance with control of the controller; wherein the row decoder may be configured to select a specified word line in accordance with control of the controller; wherein the electric power supply circuit may be configured to selectively output a fifth voltage or a sixth voltage to the selected word line in accordance with control of the controller; wherein the current restricting active element includes a first current restricting active element having a first current capacity and a second current restricting active element having a second current capacity different from the first current capacity; wherein the write pulse drive circuit may include the first current restricting active element and the second current restricting active element and is configured to output an electric pulse to the selected bit line via one of the first current restricting active element and the second current restricting active element which is selected in accordance with control of the controller; wherein when a voltage which is lower than the fifth voltage by a threshold voltage of the voltage restricting active element is a third voltage and a voltage which is lower than the sixth voltage by a threshold voltage of the voltage restricting active element is a fourth voltage, a relationship may be established such that the first voltage<the third voltage<the second voltage and the second voltage<the fourth voltage; wherein the controller may be configured to control the column decoder and the row decoder to select a resistance variable element corresponding to a cross point between a specified bit line and a specified word line; wherein the controller may be configured to control the write pulse drive circuit so as to output an electric pulse to the selected bit line via the first current restricting active element and to control the electric power supply circuit so as to output the fifth voltage to the selected word line when the selected resistance variable element is switched to the high-resistance state; and wherein the controller may be configured to control the write pulse drive circuit so as to output an electric pulse to the selected bit line via the second current restricting active element and to control the electric power supply circuit so as to output the sixth voltage to the selected word line when the selected resistance variable element is switched to the low-resistance state.

In such a configuration, it is possible to provide a resistance variable memory apparatus which is capable of surely preventing an incorrect operation or breakdown of the element when writing data with a simple configuration and using the resistance variable element which is switchable between plural resistance states in response to electric pulses which are identical in polarity and has a structure in which plural resistance variable elements are integrated as a memory array so as to have a large capacity.

In the resistance variable memory apparatus, the third voltage may be set to a value at which the voltage between electrodes of the selected resistance variable element becomes not smaller than the first voltage in a state where the selected resistance variable element is in the low-resistance state.

In the resistance variable memory apparatus, the fourth voltage may be not smaller than a voltage which is obtained by adding to the second voltage a threshold voltage of a field effect transistor which is the voltage restricting active element.

The resistance variable memory apparatus may further comprise an external electric power supply input terminal for receiving an input of an outside voltage from an external electric power supply; wherein the electric power supply circuit may be configured to output, as the fourth voltage, the outside voltage input to the external electric power supply input terminal.

In the resistance variable memory apparatus, the first current capacity may have a value at which a product of the value of the first current capacity and the first resistance value becomes not smaller than the first voltage.

In the resistance variable memory apparatus, the second current capacity may have a value at which a product of the value of the second current capacity and the second resistance value becomes not smaller than the second voltage and a product of the value of the second current capacity and the first resistance value becomes smaller than the first voltage.

The resistance variable memory apparatus may be configured to rewrite the resistance state of the resistance variable memory apparatus plural times.

In the resistance variable memory apparatus, the controller may be configured to control the current restricting active element so that an absolute value of a product of the current between electrodes and the first resistance value becomes not smaller than the first voltage and to control the voltage restricting active element so that an absolute value of the voltage between electrodes becomes smaller than the second voltage, when the resistance variable element is switched from the low-resistance state to the high-resistance state; and wherein the controller may be configured to control the current restricting active element so that an absolute value of a product of the current between electrodes and the second resistance value becomes not smaller than the second voltage and an absolute value of a product of the current between electrodes and the first resistance value becomes smaller than the first voltage, when the resistance variable element is switched from the high-resistance state to the low-resistance state.

In such a configuration, it is possible to more surely prevent an incorrect operation or breakdown of the element when writing data, with a simple configuration and using the resistance variable element which is switchable between plural resistance states in response to electric pulses which are identical in polarity.

The resistance variable memory apparatus may be configured such that a ratio of the second voltage to the first voltage is smaller than a ratio of the second resistance value to the first resistance value.

In such a configuration, by properly controlling the characteristics of the resistance variable element, it is possible to surely prevent an incorrect operation or breakdown of the element when writing data.

In the resistance variable memory apparatus, the voltage restricting active element may be a field effect transistor; one of a source and a drain of the voltage restricting active element may be connected to the resistance variable element; and the controller may be configured to control an electric potential of a gate terminal of the voltage restricting active element to restrict an electric potential of the source or the drain which is connected to the resistance variable element so that the upper limit of the absolute value of the voltage between electrodes is set to the predetermined value.

In such a configuration, the field effect transistor is allowed to serve as the voltage restricting active element.

In the resistance variable memory apparatus, the current restricting active element may be a field effect transistor; one of a source and a drain of the current restricting active element may be electrically connected to the resistance variable element; and the controller may be configured to control an electric potential of a gate terminal of the current restricting active element to restrict a current flowing between the source and the drain so that the upper limit of the absolute value of the current between electrodes is set to the predetermined value.

In such a configuration, the field effect transistor is allowed to serve as the current restricting active element.

The resistance variable memory apparatus may further comprise an electric pulse application device including a first output terminal and a second output terminal, the electric pulse application device being configured to output an electric pulse between the first output terminal and the second output terminal; a reference node; a series current path configured to electrically connect the first output terminal to the reference node; a resistance variable current path including the resistance variable element, the resistance variable current path being configured to electrically connect the reference node to the second output terminal via the resistance variable element; and a parallel current path configured to electrically connect the reference node to the second output terminal in parallel with the resistance variable current path; wherein an electric resistance of the series current path, an electric resistance of the parallel current path, an electric resistance of the resistance variable current path in a state where the resistance variable element is in the high-resistance state, and an electric resistance of the resistance variable current path in a state where the resistance variable element is in the low high-resistance state, are set to values so that an electric potential of the reference node becomes not smaller in absolute value than the second voltage when the electric pulse application device is outputting the electric pulse in a state where the resistance variable element is in the high-resistance state, while the electric potential of the reference node becomes smaller in absolute value than the first voltage even when the electric pulse application device is outputting the electric pulse after the resistance variable element has been switched to the low-resistance state.

In such a configuration, it is possible to surely prevent an incorrect operation or breakdown of the element when writing is performed to switch the element from the high-resistance state to the low-resistance state, with a simple configuration and using the resistance variable element which is switchable between plural resistance states in response to electric pulses which are identical in polarity. In addition, even when there is a variation in the electric resistances of resistance variable elements due to non-uniformity in manufacture or in operation, the voltage between electrodes can be stably maintained at a desired value when writing is performed to attain the low-resistance state. Since the resistance variable element is less subjected to an unnecessary stress in this way, life of the element is prolonged. That is, reliability of the resistance variable memory apparatus is further improved in this embodiment.

The above and further objects, features and advantages of the present invention will more fully be apparent from the following detailed description of preferred embodiments with accompanying drawings.

Effects of the Invention

The present invention has the above described configuration and achieves advantages described below. That is, it is possible to provide a resistance variable memory apparatus which is capable of surely preventing an incorrect operation or breakdown of the element when writing data with a simple configuration and using the resistance variable element which is switchable between plural resistance states in response to electric pulses which are identical in polarity.

BRIEF DESCRIPTION OF THE DRAWINGS

FIG. 12 is a view showing a change in a voltage between electrodes and a change in a current between electrodes in a case where "0" is written to the resistance variable element to which "1" has been written in Embodiment 1 of the present invention.

FIG. 13 is a view showing a change in a voltage between electrodes and a change in a current between electrodes in a case where "0" is written to the resistance variable element to which "0" has been written in Embodiment 1 of the present invention.

Figure 1:
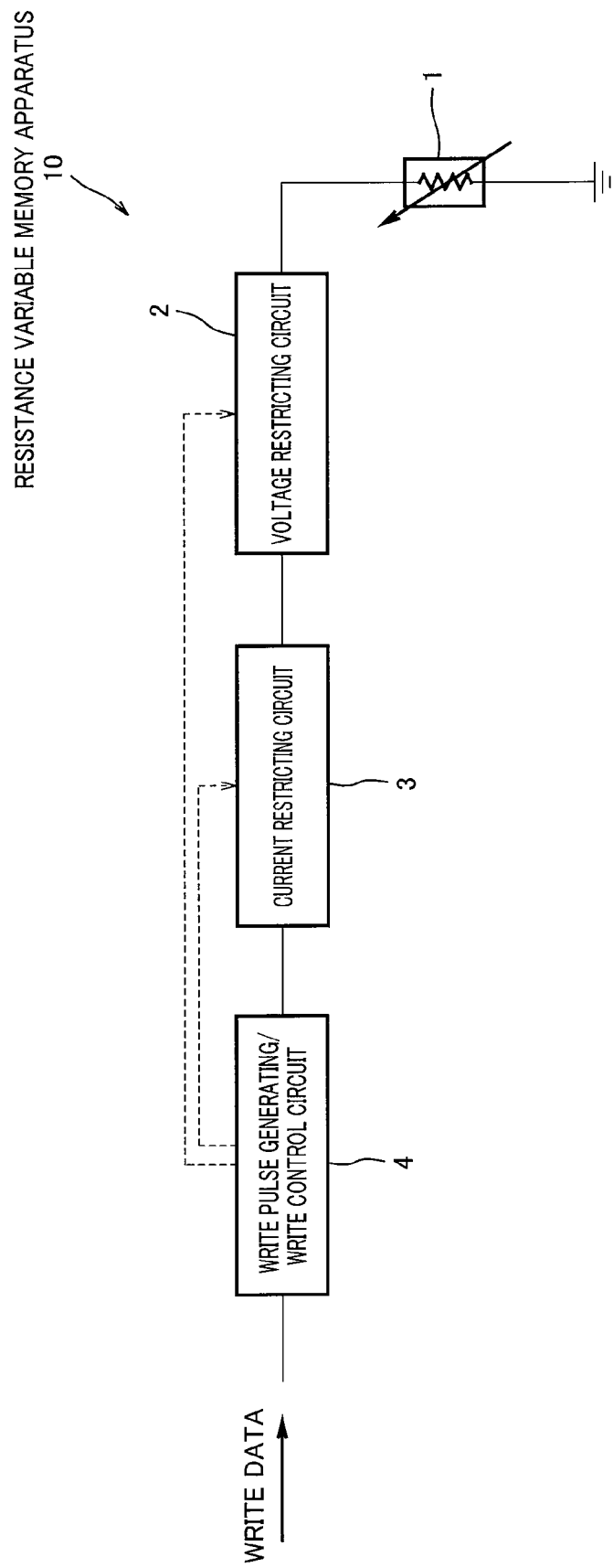
FIG. 1 is a block diagram showing a principle of a resistance variable memory apparatus of the present invention.

EXPLANATION OF REFERENCE NUMERALS 1 resistance variable element
2 voltage restricting circuit
3 current restricting circuit
4 write pulse generating/write control circuit
5 substrate
6 lower electrode
7 resistance variable layer
8 upper electrode
10 resistance variable memory apparatus
11 resistance variable element
12 selection transistor
13 source line terminal
14 word line terminal
15 bit line terminal
16 source line
17 word line
18 bit line
19 memory cell
20 nMOS
21 gate
22 drain
23 source
24 resistor
25 DC electric power supply
26 DC electric power supply
30 pMOS
31 gate
32 drain
33 source
35 DC electric power supply
36 DC electric power supply
100 resistance variable memory apparatus
110 resistance variable element
111 first terminal
112 second terminal
120 nMOS
121 gate
122 drain
123 source
130 pMOS
131 gate
132 source
133 drain
140 write pulse generating/write control circuit
200 resistance variable memory apparatus
210 resistance variable element
211 first terminal
212 second terminal
220 nMOS
221 gate
222 drain
223 source
230 pMOS
231 gate
232 source
233 drain
240 write pulse generating/write control circuit
241 voltage source
242 first output terminal
243 second output terminal
250 nMOS
251 gate
252 drain
253 source
260 pMOS
261 gate
262 source
263 drain
270 series resistor
271 reference node
280 parallel resistor
300 resistance variable memory apparatus
302 address input circuit
304 read-write control circuit
306 write pulse/timing generating circuit
308 write data determiner circuit
310 data input/output circuit
312 write pulse drive circuit
313 write pulse drive circuit
314 first pulse drive circuit
315 first pulse drive circuit
316 second pulse drive circuit
317 second pulse drive circuit
318 read circuit
320 electric power supply circuit
322 first electric power supply
324 second electric power supply
326 first transistor
328 second transistor 330 row decoder
332 word driver
334 column decoder
336 memory array
340 inverter
342 pMOS
344 pMOS
346 nMOS
348 nMOS
350 inverter
352 pMOS
354 pMOS
356 nMOS
358 nMOS
360 operational amplifier
362 operational amplifier
364 transistor
370 inverter
372 pMOS
374 pMOS
376 nMOS
378 nMOS
380 inverter
382 pMOS
384 pMOS
386 nMOS
388 nMOS
390 OR circuit
MC11, MC12, . . . MCmn memory cell
T11, T12, . . . Tmn selection transistor
R11, R12, . . . Rmn resistance variable element

BEST MODE FOR CARRYING OUT THE INVENTION

Hereinafter, preferred embodiments of the present invention will be described with reference to the drawings.
(Principle of the Present Invention)
Initially, a principle of the present invention will be described. FIG. 1 is a block diagram for explaining a principle of a resistance variable memory apparatus of the present invention. Hereinafter, the principle of a resistance variable memory apparatus 10 of the present invention will be described with reference to FIG. 1. Note that FIG. 1 is intended to show only the principle of the present invention and the resistance variable memory apparatus of the present invention can be implemented using other configuration.

As shown in FIG. 1, by way of example, the resistance variable memory apparatus 10 of the present invention comprises a resistance variable element 1 having an end electrically grounded, a voltage restricting circuit 2, a current restricting circuit 3, and a write pulse generating/write control circuit 4 (controller) which are connected in series in this order. That is, the voltage restricting circuit 2 is connected in series to the resistance variable element 1 and the voltage restricting circuit 3 is connected in series to the resistance variable element 1 via the voltage restricting circuit 2.

Figure 2:
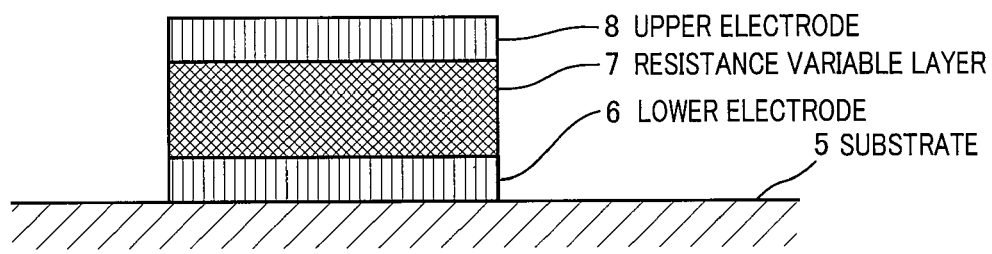
FIG. 2 is a cross-sectional view showing an example of a schematic configuration of a resistance variable element 1.

FIG. 2 is a cross-sectional view showing an example of a schematic configuration of the resistance variable element 1. As shown in FIG. 2, the resistance variable element 1 has a structure in which on a substrate 5, a lower electrode 6 (second electrode), a resistance variable layer 7, and an upper electrode 8 (first electrode) which are laminated in this order. The resistance variable layer 7 has a characteristic in which its electric resistance changes in response to an electric pulse (in this invention, square pulse is basically used but other pulses may be used) applied via the electrodes and the changed electric resistance is maintained after releasing the electric pulse. By utilizing such a characteristic, data is stored in the resistance variable element 1 based on a change in an electric resistance (electric resistance between electrodes) Rram between the lower electrode 6 and the upper electrode 8. The data is stored in the resistance variable element 1 in a non-volatile manner. The respective electrodes need not be in direct contact with the resistance variable layer 7. Other layer may be present between the respective electrodes and the resistance variable layer 7 so long as the respective electrodes are electrically connected to the resistance variable layer 7. The current between the lower electrode 6 and the upper electrode 8 is defined as a current between electrodes, and an electric potential difference (electric potential of the upper electrode 8 based on the lower electrode 6 as a reference) between the lower electrode 6 and the upper electrode 8 is defined as a voltage between electrodes.

As the material of the resistance variable layer of the resistance variable element 1, for example, there is an oxide such as NiO or TiO. As the material of the electrodes, a well-known electrode material in a semiconductor process, for example, Ti, Al, TaN, or TiN is used.

The voltage restricting circuit 2 is a circuit for setting the upper limit of the voltage (electric potential at the resistance variable element 1 side of the voltage restricting circuit 2 which is generated when the electric pulse is applied) of the electric pulse applied to the resistance variable element 1 to a predetermined value (e.g., a predetermined voltage or smaller).

The current restricting circuit 3 is a circuit for setting the upper limit of the current between electrodes of the resistance variable element 1 to a predetermined value (e.g., restricted to a predetermined current or less).

The write pulse generating/write control circuit 4 receives write data input externally, generates an electric pulse (write pulse) for writing data to the resistance variable element 1 according to the write data, and controls the upper limit value of a voltage compliance associated with the voltage restricting circuit 2 and the upper limit value of a current compliance associated with the current restricting circuit 3. The upper limit value of the voltage between electrodes which is set in the voltage restricting circuit 2 and the upper limit value of the current between electrodes which is set in the current restricting circuit 3 need not be always set to constant upper limit values. The respective upper limit values may be suitably independently set to, for example, optimal values for high-resistance state writing and for low-resistance state writing, respectively.

Figure 3:
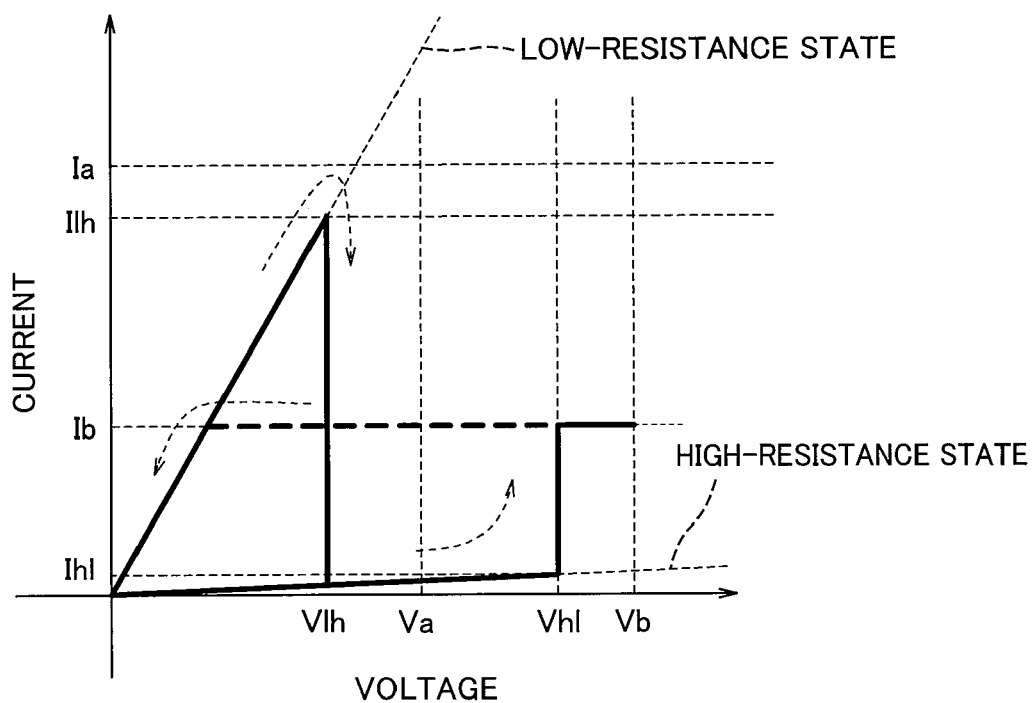
FIG. 3 is a view showing characteristics of the resistance variable element 1.
Figure 28:
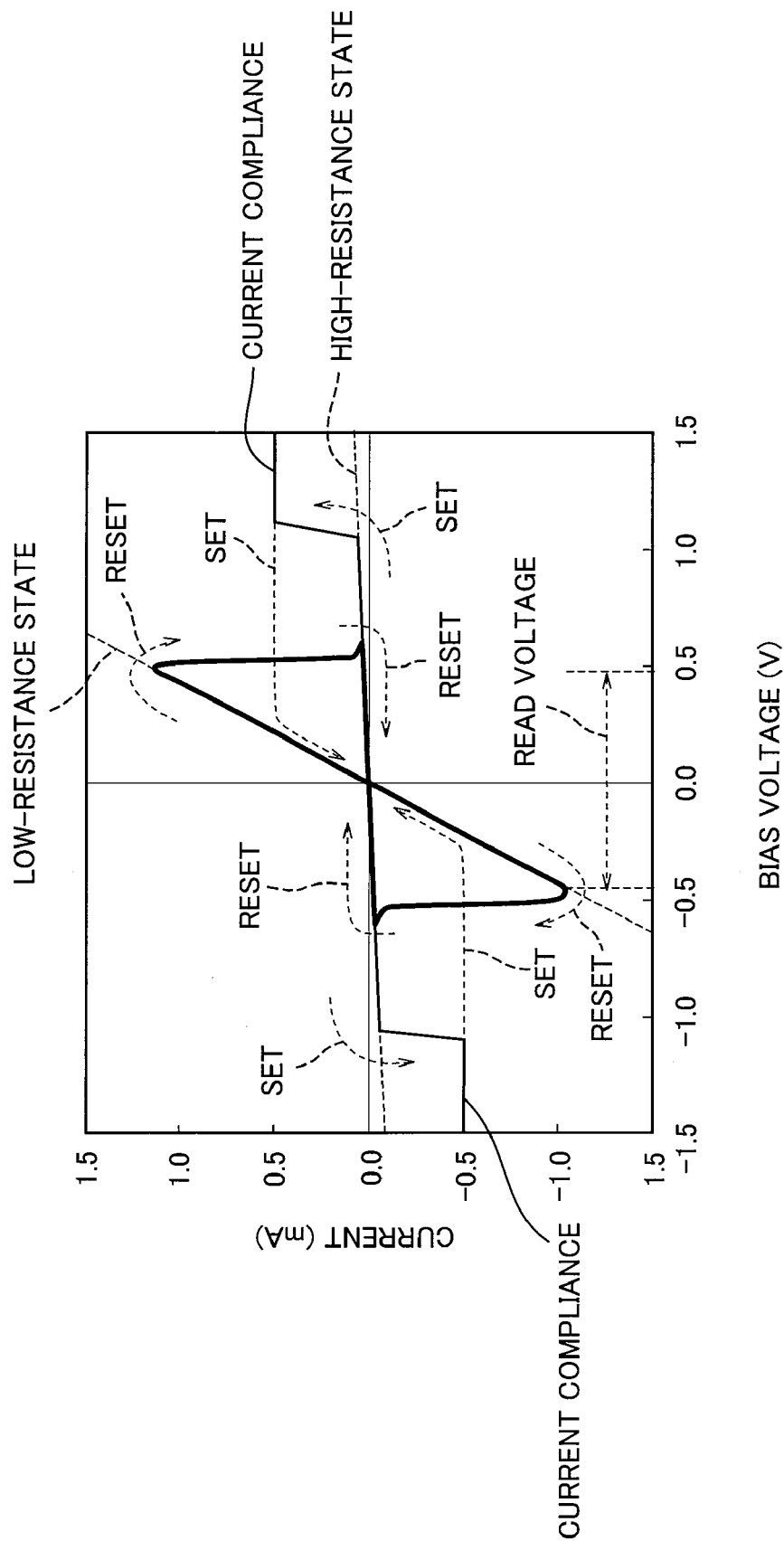
FIG. 28 is a view showing a voltage-current characteristic of a ReRAM element of Non-Patent document 1.

FIG. 3 is a view showing the characteristic of the resistance variable element 1. FIG. 3 shows a portion corresponding to only plus voltage which is extracted from the characteristic shown in FIG. 28. But, a similar characteristic is shown in a portion corresponding to minus voltage. That is, the resistance variable element 1 shows a characteristic similar to that of FIG. 28. In FIG. 3, a horizontal axis indicates a measurement value of the voltage applied to the resistance variable element and a vertical axis indicates a measurement value of the current flowing in the resistance variable element. As shown in FIG. 3, the resistance variable element 1 in the low-resistance state is switched to the high-resistance state when the absolute value of the voltage between electrodes (hereinafter "the voltage between electrodes" indicates in principle the absolute value thereof) exceeds Vlh (first voltage) (the current between electrodes exceeds Ilh), while the resistance variable element 1 in the high-resistance state is switched to the low-resistance state when the voltage between electrodes exceeds Vhl (second voltage) (the current between electrodes exceeds Ihl). Hereinafter, regarding the current between electrodes, in principle, only its absolute value should be considered and its direction should not be considered. Also, in principle, the parameters such as thresholds are supposed to be plus. Needless to say, in a case of using the voltage and the current which are minus, the same occurs by suitably changing the sign and the magnitude relationship. The electric resistance between electrodes (Rram) in the low-resistance state is defined as Rl (first resistance value) and the electric resistance between electrodes (Rram) in the high-resistance state is defined as Rh (second resistance value). As can be clearly seen from FIG. 3, Ilh is larger than Ihl and Vhl is larger than Vlh.

As shown in FIG. 3, after the resistance variable element has been switched from the low-resistance state to the high-resistance state, it is necessary to restrict the voltage between electrodes to a value which is not larger than a constant value (Va: third voltage) which is not smaller than Vlh and smaller than Vhl. On the other hand, after the resistance variable element has been switched from the high-resistance state to the low-resistance state, it is necessary to restrict the current between electrodes to a value which is not larger than a constant value (Ib) which is not smaller than Ihl and smaller than Ilh.

When the resistance variable element 1 in the low-resistance state is switched to the high-resistance state, the write pulse generating/write control circuit 4 controls the current restricting circuit 3 to set the upper limit of the current between electrodes to a value (Ia: first current capacity) which is not smaller than the value of Ilh, and controls the voltage restricting circuit 2 to set the upper limit of the voltage between electrodes to a value (Va) which is not smaller than the value of Vlh and smaller than the value of Vhl. After the setting, the write pulse generating/write control circuit 4 outputs a write pulse (write electric pulse), causing the resistance variable element 1 to be switched from the low-resistance state to the high-resistance state.

When the resistance variable element 1 in the high-resistance state is switched to the low-resistance state, the write pulse generating/write control circuit 4 controls the current restricting circuit 3 to set the upper limit of the current between electrodes to a value (Ib: second current capacity) which is not smaller than the value of Ihl and smaller than the value of Ilh, and controls the voltage restricting circuit 2 to set the upper limit of the voltage between electrodes to a value (Vb: fourth voltage) which is not smaller than the value of Vhl. After the setting, the write pulse generating/write control circuit 4 outputs a write pulse (electric pulse for writing), causing the resistance variable element 1 to be switched from the high-resistance state to the low-resistance state.

The above mentioned conditions are expressed as eight conditional expressions listed below:

$$Rl \times Ilh = Vlh \tag{1}$$

$$Rh \times Ihl = Vhl \tag{2}$$

$$Ihl < Ilh \tag{3}$$

$$Vlh < Vhl \tag{4}$$

$$Ia \geq Ilh \tag{5}$$

$$Ihl \leq Ib < Ilh \tag{6}$$

$$Vlh \leq Va < Vhl \tag{7}$$

$$Vb \geq Vhl \tag{8}$$

The conditions important in the present invention are further derived from the expressions (1), (2), and (6) as follows:

$$Rh \times Ib \geq Vhl \tag{9}$$

$$Rl \times Ib < Vlh \tag{10}$$

Furthermore, the following expression is derived from in equations (9) and (10):

$$(Vhl/Vlh) < (Rh/Rl) \tag{11}$$

That is, in the case where the resistance variable element 1 is switched from the high-resistance state to the low-resistance state, it is necessary to cause the voltage between electrodes to reach Vhl or larger when the resistance variable element 1 is in the high-resistance state (resistance value=Rh) and to restrict the voltage between electrodes to a value smaller than the value of Vlh after the resistance variable element 1 has been switched to the low-resistance state (resistance value=Rl). In order to set the current capacity Ib so as to satisfy the conditions, it is necessary to control the characteristic of the resistance variable element 1 so as to satisfy the expression (11). Actually, by suitably changing the materials of the resistance variable layer and the electrodes, the area of the electrodes, the thickness of the resistance variable layer, the degree of oxidation of the resistance variable layer, etc, the characteristics of the resistance variable element 1 are controlled so as to satisfy the conditions. That is, an apparatus structure can be suitably designed and electric parameters (values of the voltage between electrodes generated when the resistance state changes and the electric resistances between electrodes corresponding to the respective resistance states) can be controlled so as to satisfy the expression (11).

Since the electric resistance between electrodes corresponding to the high-resistance state is several-digit larger than the electric resistance between electrodes corresponding to the low-resistance state in an actual resistance variable element 1, Ihl is substantially negligible. For this reason, description will be hereinafter made assuming that Ihl is zero for the sake of simplicity.

Figure 4:
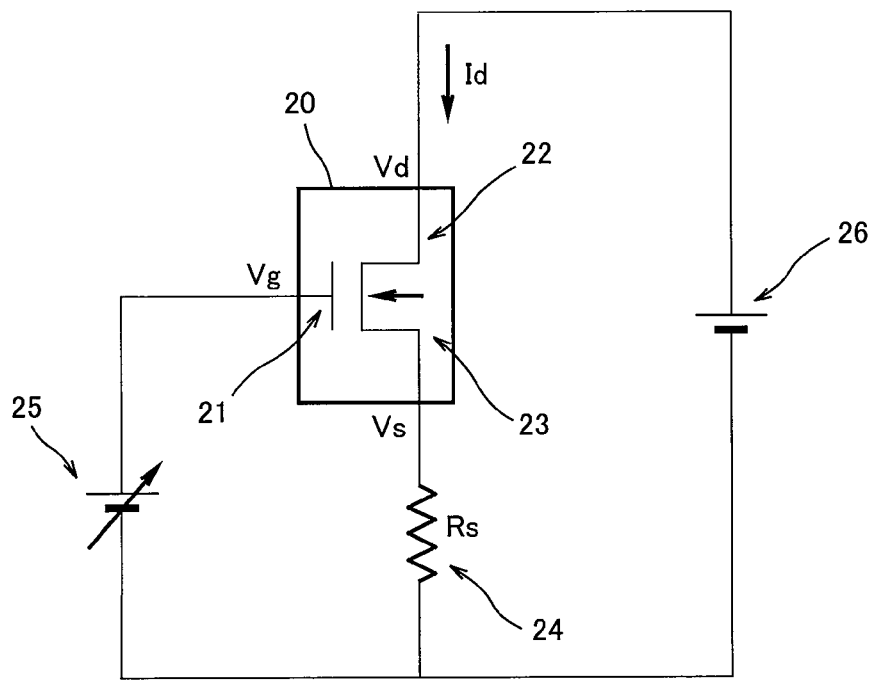
FIG. 4 is a circuit diagram showing an example of a circuit for measuring a drain current (source-drain current) flowing when a predetermined voltage is applied to the gate of a general n-channel MOS transistor (field effect transistor).

Hereinafter, a specific configuration of the voltage restricting circuit 2 will be described. FIG. 4 is a circuit diagram showing an example of a circuit for measuring a drain current (source-drain current) flowing when a predetermined voltage is applied to the gate of a general n-channel MOS transistor (field effect transistor).

In description below, it is assumed that one of the terminals which are other than the gate of the MOSFET is the source and the other is the drain, but the source and the drain may be appropriately reversed (the same occurs in all embodiments). One of the source and the drain is defined as a first main terminal and the other is defined as a second main terminal. The substrate electric potential is not particularly illustrated hereinafter, but the substrate electric potential of nMOS is a ground electric potential and the substrate electric potential of pMOS is a VDD electric potential.

As shown in FIG. 4, the circuit includes a nMOS 20 (active element), a resistor 24, a DC electric power supply 25, and a DC electric power supply 26. The gate of the nMOS 20 is connected to the plus terminal of the DC electric power supply 25, the drain of the nMOS 20 is connected to the plus terminal of the DC electric power supply 26, the source of the nMOS 20 is connected to one terminal of the resistor 24, and the other terminal of the resistor 24, the minus terminal of the DC electric power supply 25, and the minus terminal of the DC electric power supply 26 are short-circuited. Hereinafter, the value of the electric resistance of the resistor 24 is expressed as Rs, the electric potential of the gate is expressed as Vg, the electric potential of the drain is expressed as Vd, the electric potential of the source is expressed as Vs, and the current flowing from the drain to the source is expressed as Id.

Figure 5:
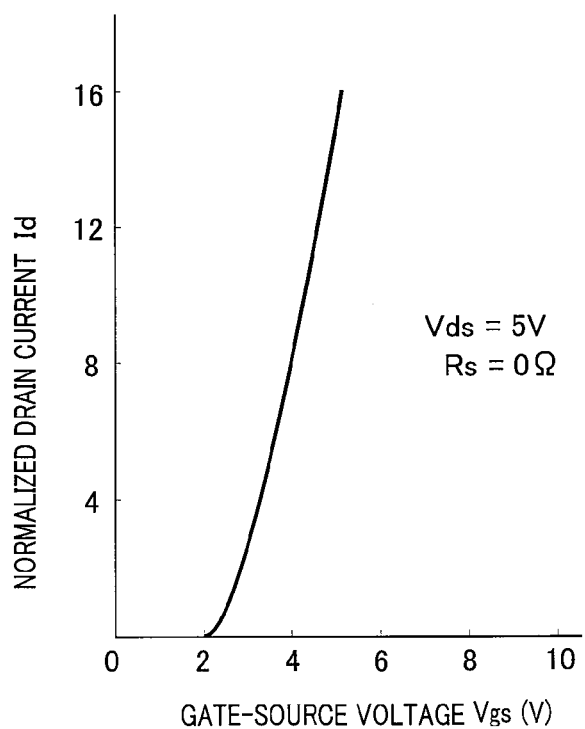
FIG. 5 is a view (example of a voltage-current characteristic of a nMOS 20) showing a drain current Id measured using the circuit of FIG. 4 in a case where Rs is 0Ω, with a horizontal axis indicating a gate-source voltage (electric potential of the gate based on the source as a reference) and a vertical axis indicating a normalized current amount.

FIG. 5 is a view showing the drain current Id measured using the circuit of FIG. 4 in a case where Rs is 0Ω, with a horizontal axis indicating a gate-source voltage (electric potential of the gate based on the source as a reference) and a vertical axis indicating a normalized current amount (example of voltage-current characteristic of nMOS 20).

As can be clearly seen from FIG. 5, the current is zero and the nMOS 20 is in an OFF-state when the gate-source voltage is 2V or smaller. In a case where Rs is not 0Ω and there is an electric potential difference between the both ends of the resistor 24, the electric potential difference (source electric potential Vs) is restricted to a value which is not larger than the value of a voltage obtained by subtracting the ON-voltage Vnt (2V in FIG. 5) of the nMOS 20 from the gate voltage Vg. That is, the voltage restricting circuit 2 can be easily implemented using the ON/OFF property of the nMOS 20. In a general memory apparatus, by using the selection transistor constituting the memory cell as the voltage restricting circuit, the voltage restricting circuit is easily implemented using the nMOS as described above. As a matter of course, a similar operation is attained using a p-channel MOS transistor (pMOS) instead of the n-channel MOS transistor.

Figure 6:
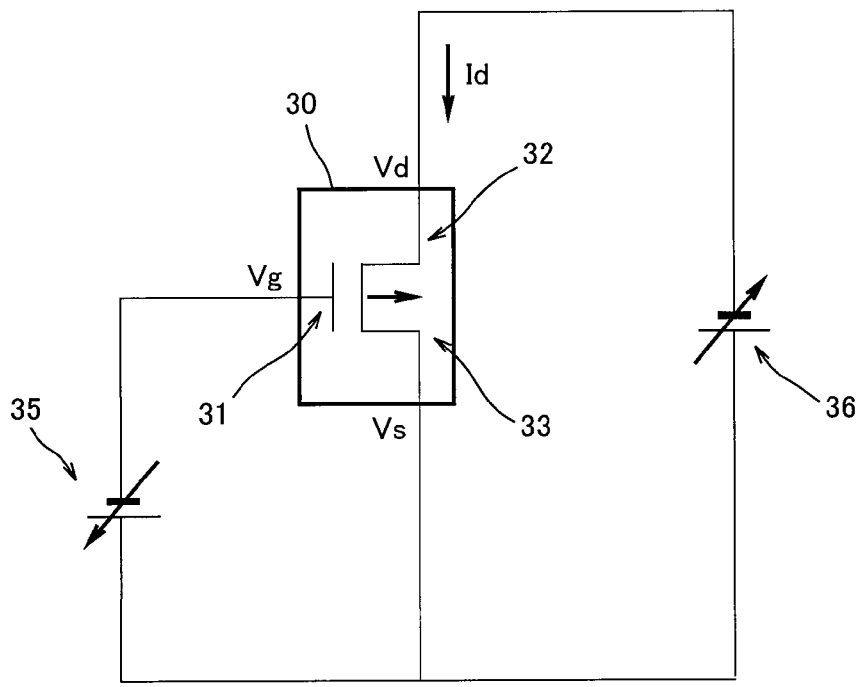
FIG. 6 is a circuit diagram showing an example of a circuit for measuring a drain current (source-drain current) flowing when a predetermined voltage is applied to the gate of a general p-channel MOS transistor (field effect transistor).

Hereinafter, the specific configuration of the current restricting circuit 3 will be described. FIG. 6 is a circuit diagram showing an example of a circuit for measuring a drain current (source-drain current) flowing when a predetermined voltage is applied to the gate of a general p-channel MOS transistor (field effect transistor).

As shown in FIG. 6, the circuit includes a pMOS 30, a DC electric power supply 35, and a DC electric power supply 36. And, the gate of the pMOS 30 is connected to the minus terminal of the DC electric power supply 35, and the drain of the pMOS 30 is connected to the minus terminal of the DC electric power supply 35, and the source of the pMOS 30, the plus terminal of the DC electric power supply 35 and the plus terminal of the DC electric power supply 36 are short-circuited. Hereinafter, the gate-source voltage is expressed as Vgs, the drain-source voltage is expressed as Vds, and the current flowing from the source to the drain is expressed as Id.

Figure 7:
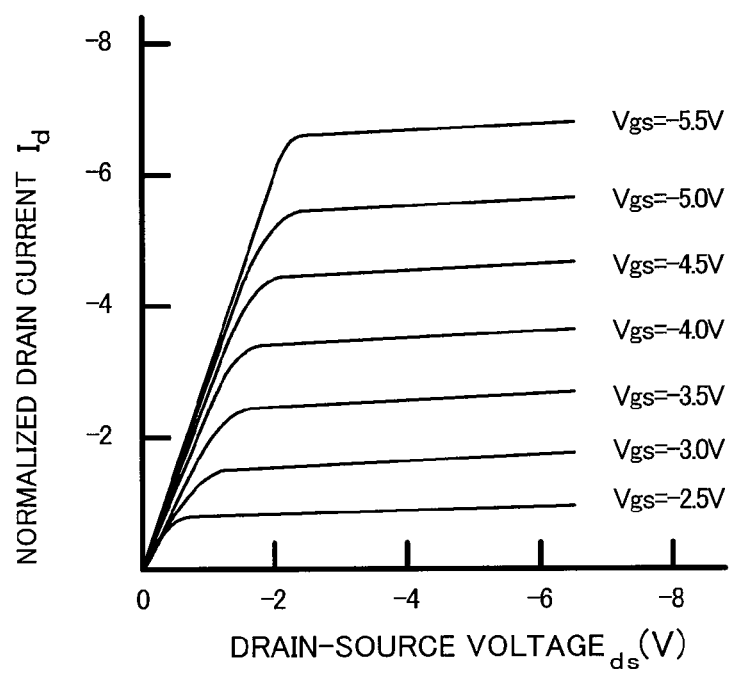
FIG. 7 is a view (example of a voltage-current characteristic of the pMOS 30) showing a drain current Id measured in a case where a gate-source voltage (Vgs) is set to a predetermined value using the circuit of FIG. 6, with a horizontal axis indicating a drain-source voltage (Vds) and a vertical axis indicating a normalized current amount.

FIG. 7 is a view showing the drain current Id measured in a case where the gate-source voltage (Vgs) is set to a predetermined value using the circuit of FIG. 6, with a horizontal axis indicating the drain-source voltage (Vds) and a vertical axis indicating a normalized current amount (example of voltage-current characteristic of pMOS 30).

As can be clearly seen from FIG. 7, there is a region (saturated region) of Vds for each of the values of Vgs in which Id is constant regardless of a change in Vds. This is described in a general technical document, and will not be explained in detail. The current amount (Id) in a saturated region in the specified gate-source voltage Vgs and a specified drain-source voltage Vds are easily designed by controlling the gate width and gate length of the transistor.

That is, by controlling the gate width and gate length of the transistor after the gate-source voltage to be applied is decided, the upper limit of Id can be controlled at a desired value. That is, the current restricting circuit 3 can be easily implemented using the characteristic of the pMOS 30. Needless to say, the similar operation is attainable using the n-channel MOS transistor (nMOS) instead of the p-channel MOS transistor.

In the present invention, the voltage restricting circuit 2 and the current restricting circuit 3 are implemented using the active elements such as MOSFET.

Plural controllers may be provided. For example, three controllers may be provided, a first controller may control the voltage restricting circuit 2, a second controller may control the current restricting circuit 3, and a third controller may control the first and second controllers. Alternatively, plural controllers may execute parallel processing (hereinafter the same occurs in Embodiments).

Embodiment 1

Hereinafter, a resistance variable memory apparatus according to Embodiment 1 of the present invention will be described.

[Configuration]

Figure 8:
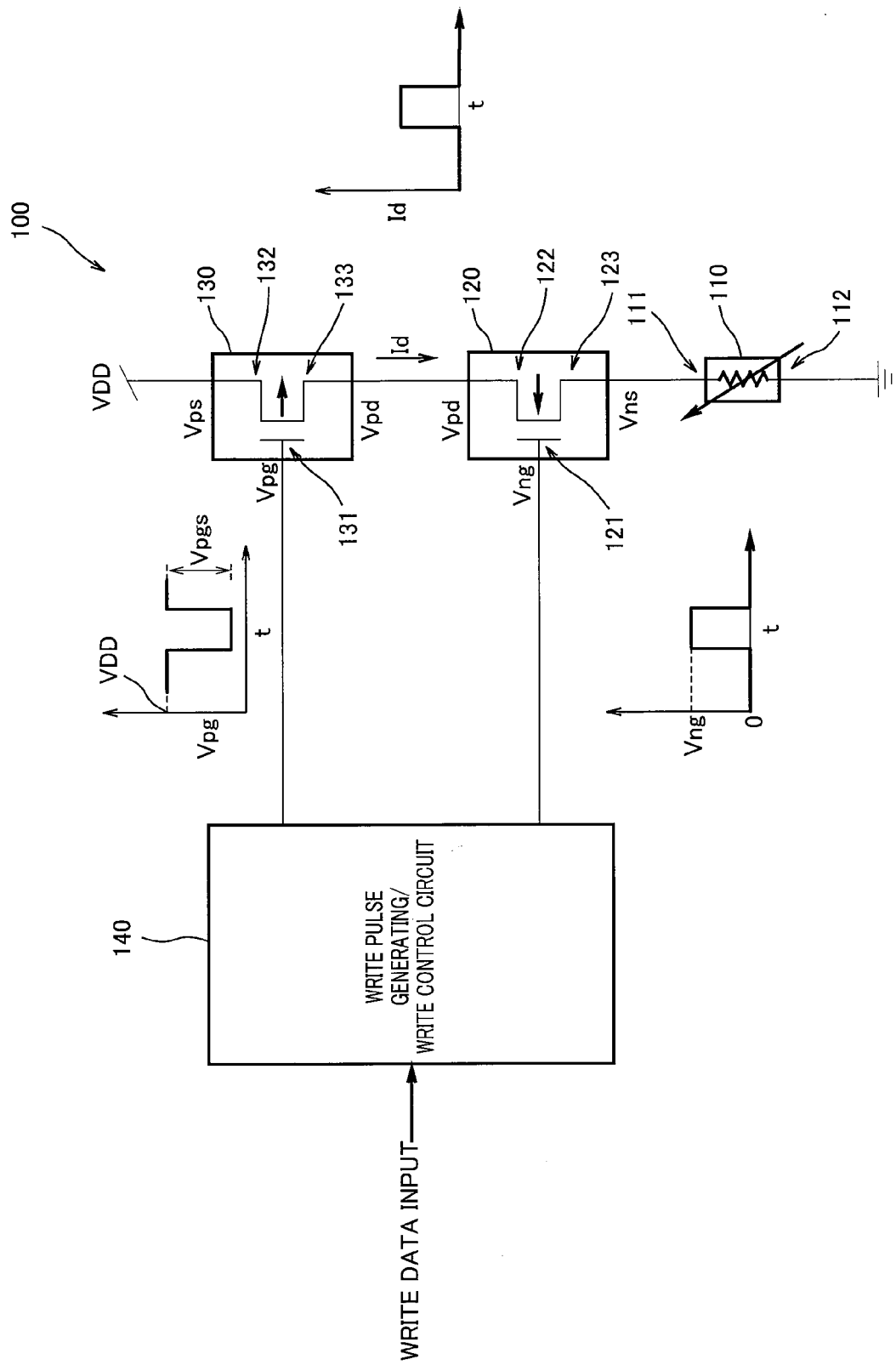
FIG. 8 is a block diagram showing an example of a schematic configuration of a resistance variable memory apparatus according to Embodiment 1 of the present invention.

FIG. 8 is a block diagram showing an example of a schematic configuration of the resistance variable memory apparatus according to Embodiment 1 of the present invention. Hereinafter, the configuration of the resistance variable memory apparatus 100 of this embodiment will be described with reference to FIG. 8.

As shown in FIG. 8, the resistance variable memory apparatus 100 comprises a resistance variable element 110, a nMOS 120 (voltage restricting active element), a pMOS 130 (current restricting active element), and a write pulse generating/write control circuit 140 (controller).

The resistance variable element 110 has a configuration similar to that of the resistance variable element 1 of FIG. 1 and has a characteristic shown in FIG. 3. The resistance variable element 110 has a first terminal 111 and a second terminal 112. The first terminal 111 is connected to the upper electrode 8 (FIG. 2) and the second terminal 112 is connected to the lower electrode 6 (FIG. 2).

The nMOS 120 is a n-channel MOS transistor which is similar to the nMOS 20 of FIG. 4 and has a gate 121 (control terminal), a drain 122 (first main terminal), and a source 123 (second main terminal). The nMOS 120 serves as a voltage restricting circuit based on the above described ON/OFF property of the transistor.

The pMOS 130 is a p-channel MOS transistor similar to the pMOS 30 of FIG. 6, and has a gate 131 (control terminal), a source 132 (second main terminal), and a drain 133 (first main terminal). The pMOS 130 serves as a current restricting circuit based on the above described property of the transistor.

The write pulse generating/write control circuit 140 is a circuit similar to the write pulse generating/write control circuit 4 of FIG. 1. The write pulse generating/write control circuit 140 controls the nMOS 120 and the pMOS 130 as the controller so that the nMOS 120 and the pMOS 130 operate as the voltage restricting circuit and the current restricting circuit, respectively.

The write pulse generating/write control circuit 140 is connected to the gate 121 of the nMOS 120 and to the gate 131 of the pMOS 130. The source 132 of the pMOS 130 is connected to a voltage source whose voltage is VDD. The drain 133 of the pMOS 130 and the drain 122 of the nMOS 120 are connected to each other. The source 123 of the nMOS 120 is connected to the first terminal 111 of the resistance variable element 110. The second terminal 112 of the resistance variable element 110 is electrically grounded.

In the nMOS 120, the voltage of the gate 121 is expressed as Vng, the voltage of the drain 122 is expressed as Vnd and the voltage of the source 123 is expressed as Vns. The electric potential of the gate 121 (source-gate voltage of the nMOS 120) based on the source 123 as a reference is expressed as Vngs. The threshold voltage of the nMOS 120 is expressed as Vnt.

In the pMOS 130, the voltage of the gate 131 is expressed as Vpg, the voltage of the source 132 is expressed as Vps, and the voltage of the drain 133 is expressed as Vpd. The electric potential (source-gate voltage of the pMOS 130) of the gate 131 based on the source 132 as a reference is expressed as Vpgs. The threshold voltage of the pMOS 130 is expressed as Vpt.

Subsequently, the conditions to be satisfied by the respective parameters will be reviewed. In FIG. 3, Ia indicates the upper limit value of the current compliance associated with the pMOS 130 in a case where the resistance variable element 110 is switched from the low-resistance state to the high-resistance state, and Ib indicates the upper limit value of the current compliance associated with the pMOS 130 in a case where the resistance variable element 110 is switched from the high-resistance state to the low-resistance state. As shown in FIG. 7, by controlling the gate width and gate length of the pMOS 130 after a predetermined value of Vpgs output from the write pulse generating/write control circuit 140 is decided, the upper limit value of the current compliance associated with the pMOS 130 can be set to a desired value.

As described above, the conditions to be satisfied by Ia and Ib are as follows:

$$Ia \geq Ilh \quad (5)$$

$$Ihl \leq Ib < Ilh \quad (6)$$

To attain stability of the operation, it is desired that Ia be set to have an allowance with respect to Ilh. For the same reason, Ib is desirably set to have an allowance with respect to Ihl and Ilh (e.g., Ib is set to have an equal allowance with respect to Ihl and Ilh).

Since Vps is equal to VDD, Vpgs is controlled by controlling Vpg by the write pulse generating/write control circuit 140 in actual cases. In this embodiment, pMOS is used to set a current compliance, and Vpgs is a value smaller than the value of VDD. A person skilled in the art can easily practice setting Vpgs and a saturated current value to optimal values by controlling the gate width and gate length of the pMOS according to the upper limit value of the current compliance decided, and therefore this will not be described in detail. Since the saturated current changes by changing the voltage of Vpgs using one transistor, the above described restricted current amounts Ia and Ib are attained by changing the voltage amount of Vpgs. As a matter of course, one of two transistors having different current capacities may be selectively used with the voltage amount of Vpgs being constant.

In FIG. 3, Va indicates the upper limit value of the voltage compliance associated with the nMOS 120 in a case where the resistance variable element 110 is switched from the low-resistance state to the high-resistance state, and Vb indicates the upper limit value of the voltage compliance associated with the nMOS 120 in a case where the resistance variable element 110 is switched from the high-resistance state to the low-resistance state. The upper limit value of the voltage compliance associated with the nMOS 120 is controlled by controlling Vng at a predetermined value by the write pulse generating/write control circuit 140 as shown in FIG. 5.

Figure 9:
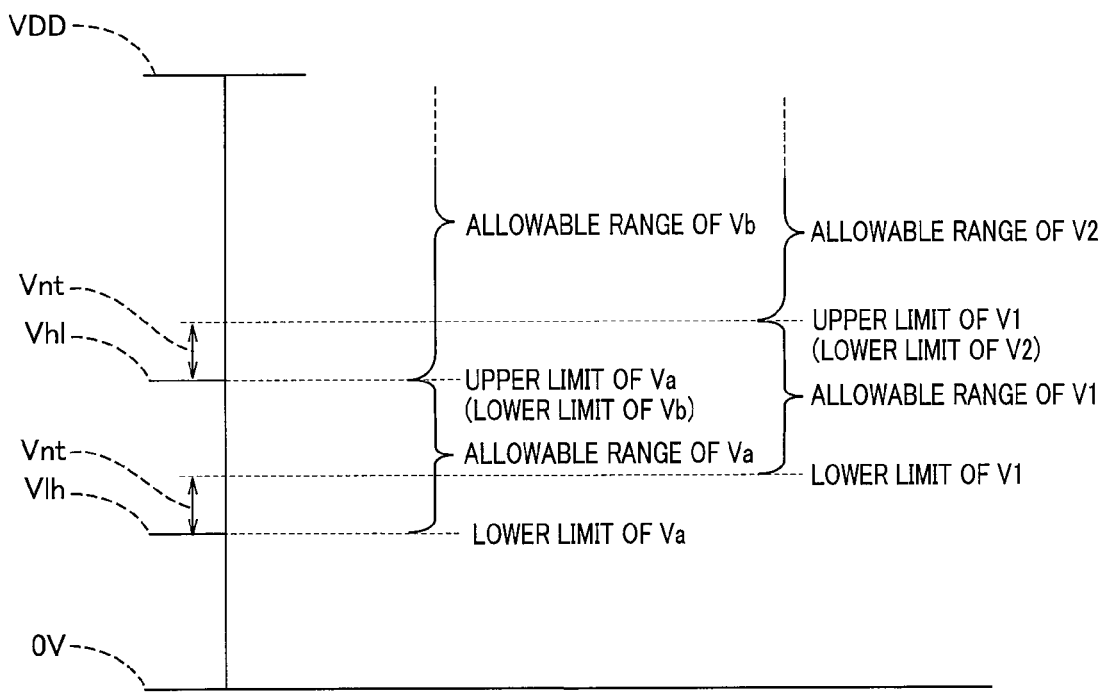
FIG. 9 is a view showing conditions to be satisfied by Vng in Embodiment 1 of the present invention.

FIG. 9 is a view showing the conditions to be satisfied by Vng in Embodiment 1 of the present invention. Va and Vb in FIG. 9 are values determined by the characteristic of the resistance variable element 110 as shown in FIG. 3. V1 (fifth voltage) indicates a value (value of a voltage to be applied by the write pulse generating/write control circuit 140 to the gate 121 of the nMOS 120) of Vng in a case where the resistance variable element 110 is switched from the low-resistance state to the high-resistance state. V2 (sixth voltage) is a value (value of a voltage to be applied by the write pulse generating/write control circuit 140 to the gate 121 of the nMOS 120) of Vng in a case where the resistance variable element 110 is switched from the high-resistance state to the low-resistance state.

As can be seen from expression (7) and expression (8), Va is not smaller than Vlh and smaller than Vhl and Vb is not smaller than Vhl (see FIG. 9). Since V1 is a value larger than the value of Va by Vnt, the condition to be satisfied by V1 is as follows:

$$Vlh + Vnt \leq V1 < Vhl + Vnt \quad (12)$$

Since V2 is a value larger than the value of Vb by Vnt, the condition to be satisfied by V2 is as follows:

$$Vhl + Vnt \leq V2 \quad (13)$$

As V1 and V2, specific values can be suitably selected so long as they satisfy their respective conditions. To attain stability of the operation, it is desired that V1 be set to have a certain allowance with respect to (Vlh+Vnt) and (Vhl+Vnt) (e.g., to have an equal electric potential difference with respect to (Vlh+Vnt) and (Vhl+Vnt). For the similar reason, it is desired that V2 be set to have a certain allowance with respect to (Vhl+Vnt).

[Operation]

Subsequently, the operation of the resistance variable memory apparatus 100 will be described. Hereinbelow, it is assumed that "0" corresponds to the high-resistance state and "1" corresponds to the low-resistance state, but the correspondence may be reversed.

Figure 10:
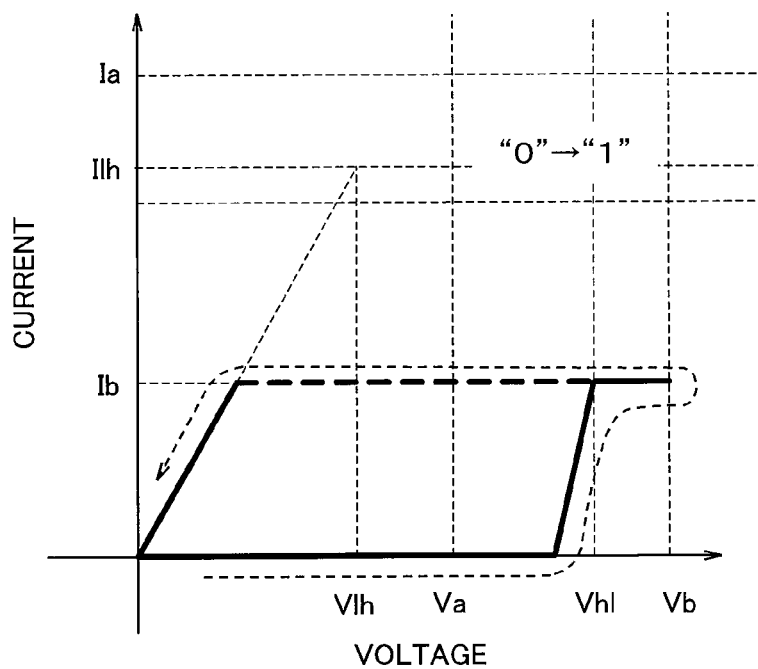
FIG. 10 is a view showing a change in a voltage between electrodes and a change in a current between electrodes in a case where "1" is written to a resistance variable element to which "0" has been written in Embodiment 1 of the present invention.
Figure 11:
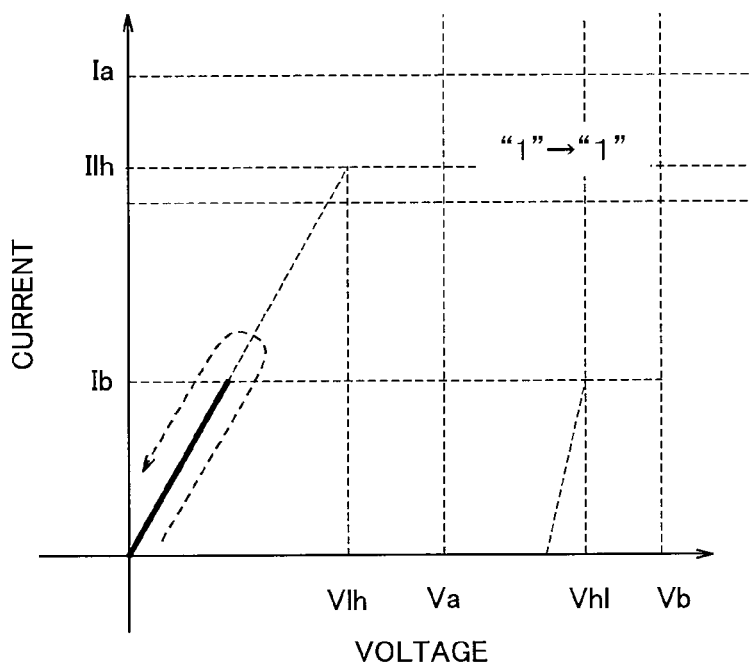
FIG. 11 is a view showing a change in a voltage between electrodes and a change in a current between electrodes in a case where "1" is written to the resistance variable element to which "1" has been written in Embodiment 1 of the present invention.
Figure 1:
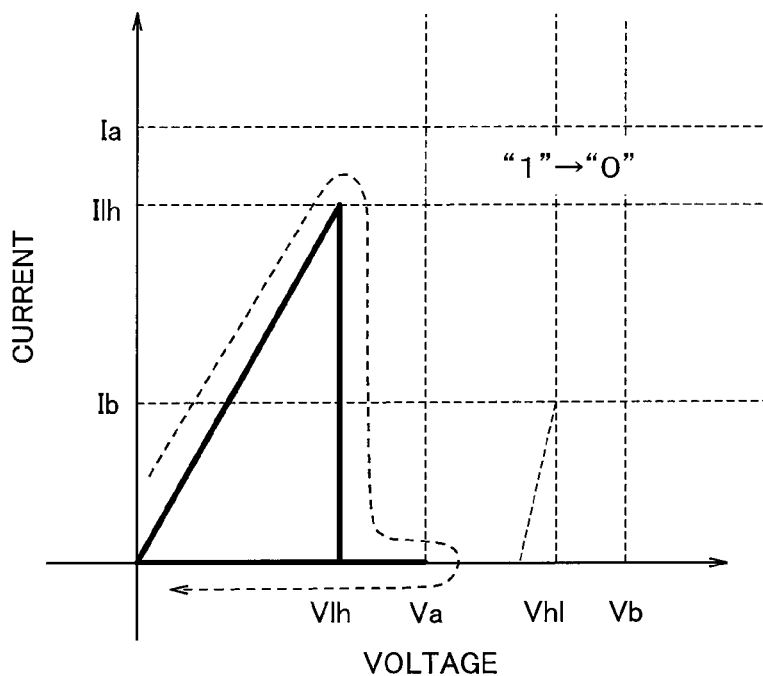
Figure 1:
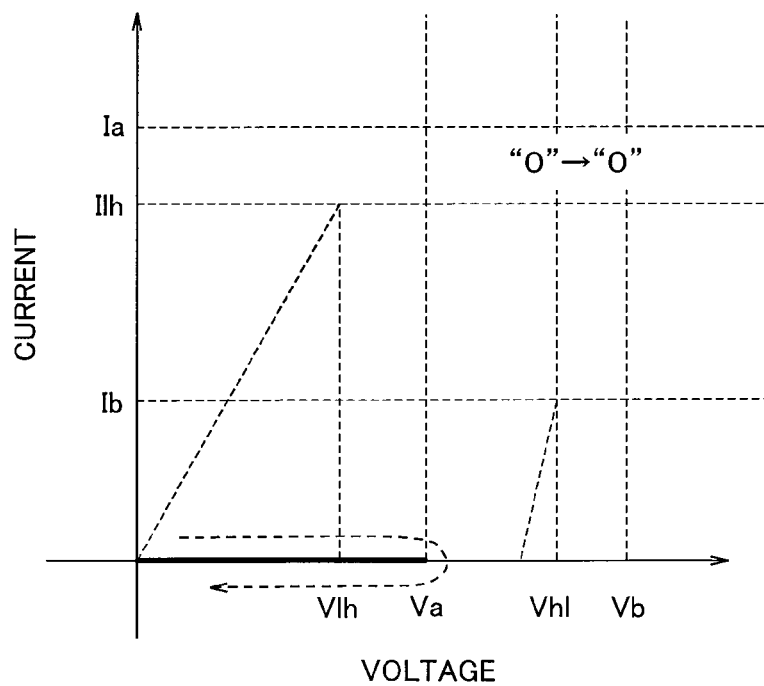

FIG. 10 is a view showing a change in the voltage between electrodes and a change in the current between electrodes in a case where "1" is written to the resistance variable element to which "0" has been written in Embodiment 1 of the present invention. FIG. 11 is a view showing a change in the voltage between electrodes and a change in the current between electrodes in a case where "1" is written to the resistance variable element to which "1" has been written in Embodiment 1 of the present invention. FIG. 12 is a view showing a change in the voltage between electrodes and a change in the current between electrodes in a case where "0" is written to the resistance variable element to which "1" has been written in Embodiment 1 of the present invention. FIG. 13 is a view showing a change in the voltage between electrodes and a change in the current between electrodes in a case where "0" is written to the resistance variable element to which "0" has been written in Embodiment 1 of the present invention. In FIGS. 10 to 13, the graphics are created in such a manner that actual measurement values of the voltage between electrodes and the current between electrodes are imaginarily drawn, and therefore the illustrated measurement values do not always correctly indicate values obtained by actual measurement. In addition, since the electric resistance between electrodes corresponding to the high-resistance state is several-digit higher than the electric resistance between electrodes corresponding to the low-resistance state as described above, the graphics are created supposing that the current corresponding to the high-resistance state is substantially zero.

Hereinafter, the write operation of the resistance variable memory apparatus 100 will be described with reference to FIG. 8 and FIG. 10 to FIG. 13.

In the operation in which the resistance variable memory apparatus 100 writes data to the resistance variable element 110, initially, the write pulse generating/write control circuit 140 receives data from outside. The write pulse generating/write control circuit 140 determines whether the write data is "1" or "0." When the resistance variable memory apparatus 100 does not write data, Vpg is set to VDD, and Vng is set to a ground voltage (GND=0).

In a case where the write data is "1" (the resistance variable element 110 is switched to the low-resistance state), the voltage of Vpg is changed to a value which is a predetermined voltage value smaller than the value VDD for a specified time, and the upper limit value of the current compliance associated with the pMOS 130 is controlled at Ib (<Ilh). At the same time, Vng is changed to V2 for the specified time, and the upper limit value of the voltage compliance associated with the nMOS 120 is controlled at Vb (≧Vhl). With such an operation, an electric pulse is applied between the first terminal 111 and the second terminal 112 of the resistance variable element 110 under the condition in which the upper limit value of the voltage between electrodes is Vb and the upper limit value of the current between electrodes is Ib.

When the write data is "1" and the resistance variable element 110 is in the high-resistance state ("0"), the voltage between electrodes and the current between electrodes change as indicated by a broken line in FIG. 10 when writing data. To be specific, upon the application of the electric pulse to the resistance variable element 110, the voltage between electrodes rises from zero while the current between electrodes is maintained at substantially zero. Since the upper limit of the voltage between electrodes is Vb, the voltage between electrodes reaches Vhl. As a result, the resistance state of the resistance variable element 110 is switched from the high-resistance state to the low-resistance state and the current between electrodes rises up to Ib. Finally, the current between electrodes and the voltage between electrodes respectively converge to zero when the application of the electric pulse is finished. Since the upper limit value of the current between electrodes is set to Ib, the voltage between electrodes corresponding to the low-resistance state is suppressed to a value smaller than the value of Vlh. Therefore, the event that the resistance variable element 110 is inadvertently switched to the high-resistance state ("0") after the element 110 has been switched to the low-resistance state ("1") does not occur. In addition, since the upper limit is set in the current between electrodes, breakdown of the resistance variable element 110 due to an excess current does not occur.

When the write data is "1" and the resistance variable element 110 is in the low-resistance state ("1"), the voltage between electrodes and the current between electrodes change as indicated by a broken line in FIG. 11 when writing data. To be specific, upon the application of the electric pulse to the resistance variable element 110, the current between electrodes and the voltage between electrodes rise along the line corresponding to the low-resistance state. The current between electrodes and the voltage between electrodes converge to zero when the application of the electric pulse is finished. In such a process, since the upper limit value of the current between electrodes is set to Ib, the voltage between electrodes is suppressed to a value smaller than the value of Vlh. Therefore, the event that the resistance variable element 110 is inadvertently switched to the high-resistance state ("0") does not occur. In addition, since the upper limit is set in the current between electrodes, breakdown of the resistance variable element 110 due to an excess current does not occur.

In a case where the write data is "0" (the resistance variable element 110 is switched to the high-resistance state), the voltage of Vpg is changed to a value which is a predetermined voltage value smaller than the value of VDD for a specified time, and the upper limit value of the current compliance associated with the pMOS 130 is controlled at Ia (≧Ilh). At the same time, Vng is changed to V1 for the specified time, and the upper limit value of the voltage compliance associated with the nMOS 120 is controlled at Va (<Vhl). With such an operation, an electric pulse is applied between the first terminal 111 and the second terminal 112 of the resistance variable element 110 under the condition in which the upper limit value of the voltage between electrodes is Va and the upper limit value of the current between electrodes is Ia.

When the write data is "0" and the resistance variable element 110 is in the low-resistance state ("1"), the voltage between electrodes and the current between electrodes change as indicated by a broken line in FIG. 12 when writing data. To be specific, upon the application of the electric pulse to the resistance variable element 110, the current between electrodes and the voltage between electrodes rise along the line of the low-resistance state. Since the upper limit of the current between electrodes is Ia, the current between electrodes reaches Ilh. At this time, the voltage between electrodes reaches Vlh, and as a result, the resistance state of the resistance variable element 110 is switched from the low-resistance state to the high-resistance state and the current between electrodes drops to substantially zero. Finally, the current between electrodes and the voltage between electrodes converge to zero when the application of the electric pulse is finished. Since the upper limit value of the voltage between electrodes is set to Va, the voltage between electrodes corresponding to the high-resistance state is suppressed to a value smaller than the value of Vhl. Therefore, the event that the resistance variable element 110 is inadvertently switched to the low-resistance state ("1") after the element 110 has been switched to the high-resistance state ("0") does not occur.

When the write data is "0" and the resistance variable element 110 is in the high-resistance state ("0"), the voltage between electrodes and the current between electrodes change as indicated by a broken line in FIG. 13 when writing data. To be specific, upon the application of the electric pulse to the resistance variable element 110, the voltage between electrodes rise while the current between electrodes is maintained at approximately zero. The current between electrodes and the voltage between electrodes converge to zero when the application of the electric pulse is finished. In such a process, since the upper limit value of the voltage between electrodes is set to Va, the voltage between electrodes is suppressed to a value smaller than the value of Vhl. Therefore, the event that the resistance variable element 110 is inadvertently switched to the low-resistance state ("1") does not occur.

In the data read operation of the resistance variable memory apparatus 100, a predetermined voltage (smaller than Vlh) is applied to the resistance variable element 110 and the current between electrodes is detected, thereby detecting the resistance state of the resistance variable element 110. The detailed description of the specific operation will be omitted because a known configuration and a known method can be used.

[Advantage]

In accordance with the resistance variable memory apparatus 100, it is possible to provide a resistance variable memory apparatus which is capable of surely preventing an incorrect operation or breakdown of the element when writing data with a simple configuration and using the resistance variable element which is switchable between plural resistance states in response to electric pulses which are identical in polarity.

In the case where "1" is written in the resistance variable memory apparatus 100 of this embodiment, it is not necessary to change the voltage and pulse width of the electric pulses to be applied depending on the current resistance state (i.e., "0"

or "1") of the resistance variable element 110. In addition, in the case where "0" is written in the resistance variable memory apparatus 100, it is not necessary to change the voltage and pulse width of the electric pulses to be applied depending on the current resistance state (i.e., "1" or "0") of the resistance variable element 110. With such a feature, it is not necessary to read the resistance state of the resistance variable element prior to the write operation, and high-speed writing is achieved. In addition, since it is not necessary to reset the resistance state of the resistance variable elements (e.g., all the resistance variable elements are reset to the low-resistance state) prior to the write operation, an unnecessary stress is not applied to the resistance variable elements. This makes it possible to provide a nonvolatile memory apparatus with higher reliability.

[Modification]

Figure 14:
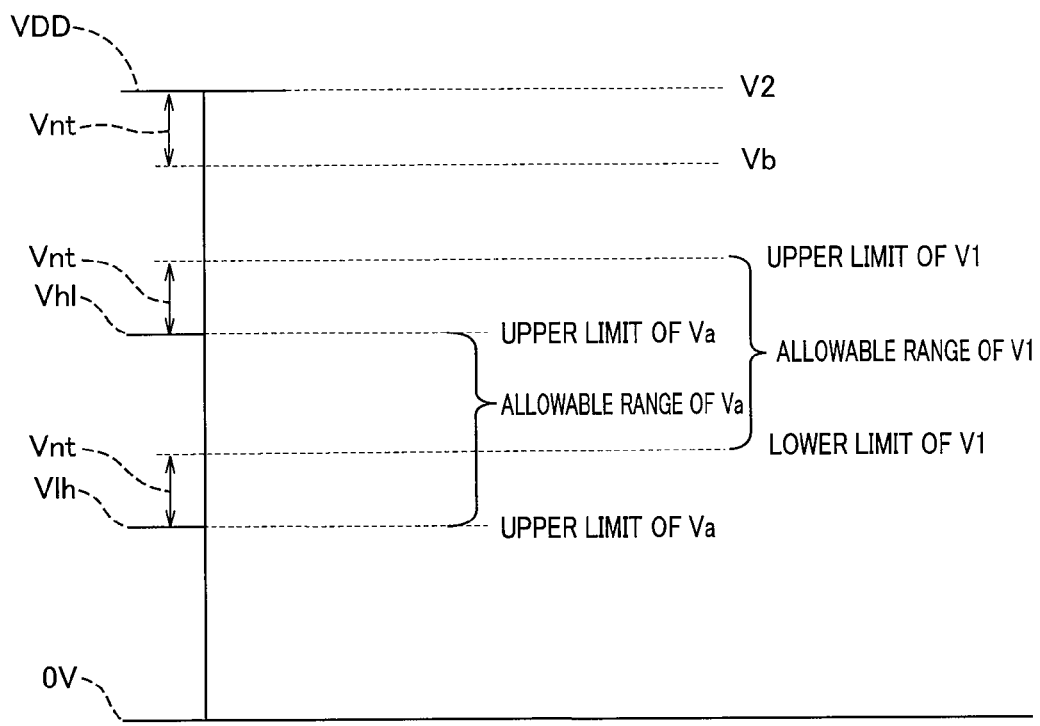
FIG. 14 is a view showing conditions to be satisfied by Vng in modification of Embodiment 1 of the present invention.

V2 may be equal to VDD. FIG. 14 is a view showing the conditions to be satisfied by Vng in modification of Embodiment 1 of the present invention. Va, Vb, V1, and V2 indicate the same as those in FIG. 9. In modification, since the configuration in which the write pulse generating/write control circuit 140 directly outputs VDD to the gate 121 of the nMOS 120 as V2 is sufficient, the circuit configuration can be simplified.

Embodiment 2

Hereinafter, a resistance variable memory apparatus according to Embodiment 2 of the present invention will be described.

[Configuration]

Figure 15:
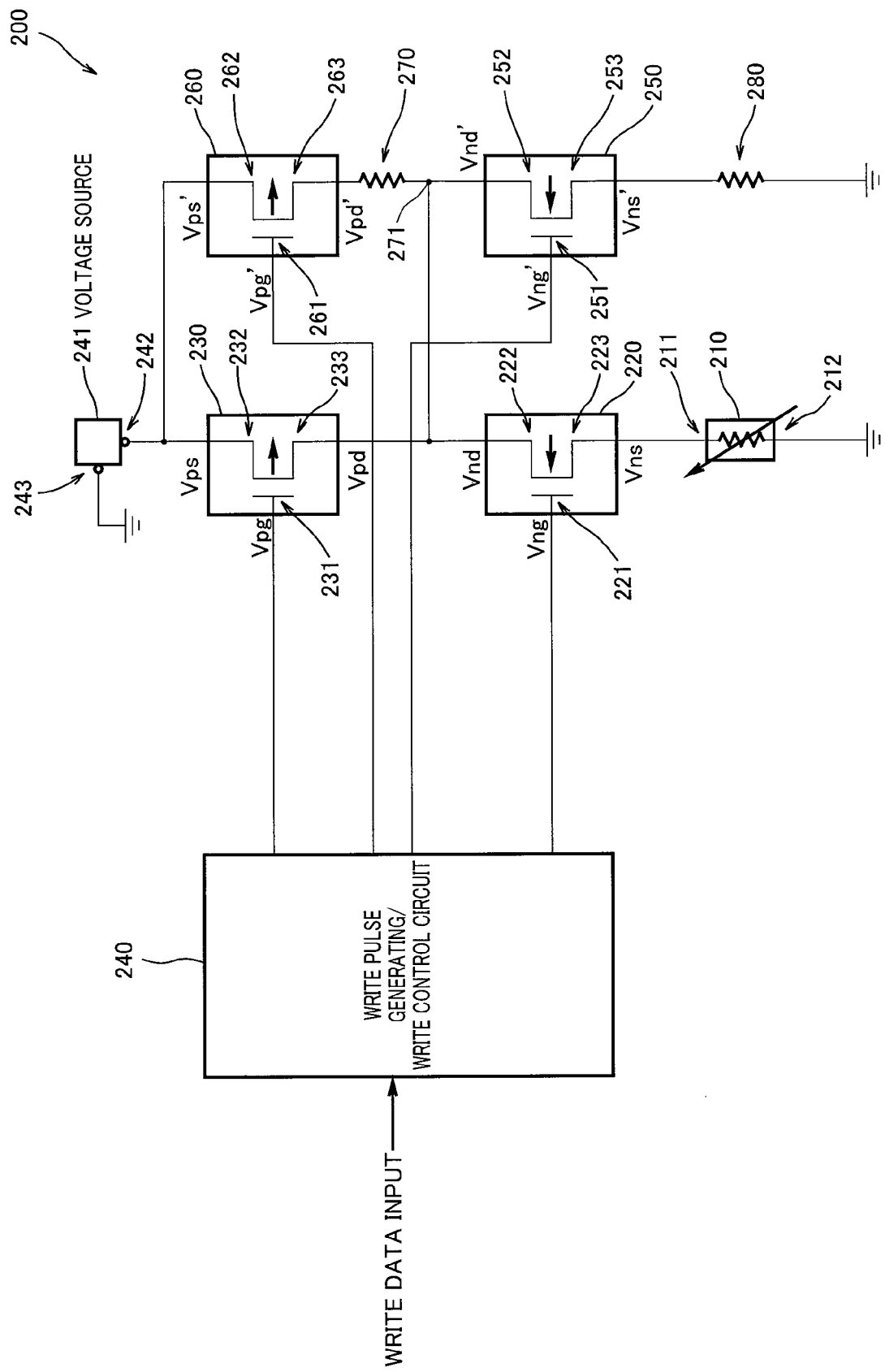
FIG. 15 is a block diagram showing an example of a schematic configuration of a resistance variable memory apparatus according to Embodiment 2 of the present invention.

FIG. 15 is a block diagram showing an example of a schematic configuration of the resistance variable memory apparatus according to Embodiment 2 of the present invention. Hereinafter, the configuration of a resistance variable memory apparatus 200 of this embodiment will be described with reference to FIG. 15.

As shown in FIG. 15, the resistance variable memory apparatus 200 comprises a resistance variable element 210, a nMOS 220 (voltage restricting active element), a pMOS 230 (current restricting active element), a write pulse generating/write control circuit 240 (controller), a voltage source 241, a nMOS 250, a pMOS 260, a series resistor 270, and a parallel resistor 280.

Since the resistance variable element 210, the nMOS 220, the pMOS 230, and the write pulse generating/write control circuit 240 are similar to the resistance variable element 110, the nMOS 120, the pMOS 130, and the write pulse generating/write control circuit 140 in Embodiment 1 respectively, detailed description thereof is omitted.

The nMOS 250 is a general n-channel MOS transistor, and has a gate 251 (control terminal), a drain 252 (first main terminal), and a source 253 (second main terminal). The nMOS 250 serves as a switching element based on the ON/OFF property of the transistor.

The pMOS 260 is a general p-channel MOS transistor, and has a gate 261 (control terminal), a source 262 (second main terminal), and a drain 263 (first main terminal). The pMOS 260 serves as a switching element based on the ON/OFF property of the transistor.

The series resistor 270 is a resistor element whose electric resistance is Rs, but the electric resistance may be implemented by wire resistance.

The parallel resistor 280 is a resistor element whose electric resistance is Rp, but the electric resistance may be implemented by wire resistance.

The voltage of the voltage source 241 is VDD. The voltage source 241 has a first output terminal 242 and a second output terminal 243. The first output terminal 242 is connected to the source of the pMOS 260, and the second output terminal 243 is electrically grounded. The voltage source 241, the write pulse generating/write control circuit 240, and the pMOS 260 constitute an electric pulse application device.

The gate 251 of the nMOS 250 and the gate 261 of the pMOS 260 are respectively connected to the write pulse generating/write control circuit 140. The source 262 of the pMOS 260 is connected to the voltage source whose voltage is VDD. The drain 263 of the pMOS 260 and the drain 252 of the nMOS 250 are electrically connected to each other via the series resistor 270. The source 253 of the nMOS 250 is connected to one end of the parallel resistor 280. The other end of the parallel resistor 280 is electrically grounded. A point (reference node 271) between the series resistor 270 and the drain 252 of the nMOS 250 is connected to a point between the drain 233 of the pMOS 230 and the drain 222 of the nMOS 220. In such a configuration, by turning OFF the pMOS 230 and turning ON the other MOSs, there are formed a first path "voltage source 241→pMOS 260→series resistor 270→reference node 271→nMOS 220→resistance variable element 210→GND" and a second path "voltage source 241→pMOS 260→series resistor 270→reference node 271→nMOS 250→parallel resistor 280→GND." In these paths, the series resistor 270 has a series relationship with the resistance variable element 210, while the parallel resistor 280 has a parallel relationship with the resistance variable element 210. The path extending from the first output terminal 242 to the reference node 271 is named a series current path. The path extending from the reference node 271 to the ground point via the resistance variable element 210 is named a resistance variable current path. The path extending from the reference node 271 to the ground point via the parallel resistor 280 is named a parallel current path.

In the nMOS 250, the voltage of the gate 251 is expressed as Vng', the voltage of the drain 252 is expressed as Vnd' and the voltage of the source 253 is expressed as Vns'. The electric potential (source-gate voltage of the nMOS 250) of the gate 251 based on the source 253 as a reference is expressed as Vngs'. The threshold voltage of the nMOS 250 is expressed as Vnt'.

In the pMOS 260, the voltage of the gate 261 is expressed as Vpg', the voltage of the source 262 is expressed as Vps', and the voltage of the drain 263 is expressed as Vpd'. The electric potential (source-gate voltage of the pMOS 260) of the gate 261 based on the source 262 as a reference is expressed as Vpgs'. The threshold voltage of the pMOS 260 is expressed as Vpt'.

The conditions to be satisfied by Rs and Rp will be reviewed. The series resistor 270 and the parallel resistor 280 are used only in the case where the resistance variable element 210 is switched from the high-resistance state to the low-resistance state. A composite electric resistance PR of the resistance variable element 210 (electric resistance: Rram) and the parallel resistor 280 (electric resistance: Rp) is given by the following approximate equation, supposing that the pMOS 230 is OFF and the ON-resistances of the other MOSs are negligible for the sake of simple explanation:

$$RR = \frac{Rram \times Rp}{Rram + Rp} \qquad (14)$$

Therefore, the electric potential V (=Vnd') of the reference node 271 is calculated as follows from a voltage division relationship of the resistance:

$$V = \frac{VDD}{Rs\left(\frac{Rram + Rp}{Rram \times Rp}\right) + 1} \quad (15)$$

The electric potential of the reference node 271 is equal to the electric potential (voltage between electrodes) of the first terminal 211 of the resistance variable element 210 supposing that an electric potential drop at the nMOS 220 is negligible. When V≧Vhl (second voltage) is established in the state where the resistance variable element 210 is in the high-resistance state (Rram=Rh), the resistance variable element 210 is switched from the high-resistance state to the low-resistance state. From the condition, the following expression is derived:

$$\frac{VDD \times Rp - Vhl \times Rp}{Vhl + \frac{Vhl \times Rp}{Rh}} \geq Rs \quad (16)$$

When V<Vlh (first voltage) is established in the state where the resistance variable element 210 is in the low-resistance state (Rram=Rl), it is possible to prevent that the resistance variable element 210 is inadvertently switched to the high-resistance state. From the condition, the following expression is derived:

$$\frac{VDD \times Rp - Vlh \times Rp}{Vlh + \frac{Vlh \times Rp}{Rl}} < Rs \quad (17)$$

The values of Rs, Rp, and VDD are designed according to the values of Rh, Rl, Vlh and Vhl so as to satisfy the expression (16) and the expression (17). In other words, the electric resistances of the four current paths which are the series current path, the parallel current path, the resistance variable current path in the state where the resistance variable element 210 is in the low-resistance state, and the resistance variable current path in the state where the resistance variable element 210 is in the high-resistance state are respectively set, so as to satisfy the expression (16) and the expression (17).

The specific examples are illustrated below. Rh is set to 50 kΩ, Rl is set to 5 kΩ, Vlh is set to 2V, Vhl is set to 3.5V, VDD is set to 5V, and Rp is set to, for example 30 kΩ as a value which is practicable in the semiconductor process. When the respective values are assigned to the expression (16) and the expression (17), the following condition is derived:

6429[Ω]<Rs≦8036[Ω]

For example, Rs is set to 8000[Ω] so that Vhl is close to 3.5V. In accordance with the above described condition, when the electric pulse is applied so that Vpd' becomes 5V under control of the write pulse generating/write control circuit 210 in the state where the resistance variable element 210 is in the high-resistance state, V (=Vnd') becomes 3.5V and the resistance variable element 210 is switched to the low-resistance state. After the resistance variable element 210 has been switched to the low-resistance state, V becomes 1.7V which is sufficiently smaller than Vlh (2.0V). Therefore, the event that the element 210 is inadvertently switched to the high-resistance state does not occur.

[Operation]

Subsequently, the operation of the resistance variable memory apparatus 200 will be described. Hereinbelow, it is assumed that "0" corresponds to the high-resistance state and "1" corresponds to the low-resistance state, but the correspondence may be reversed.

In the operation in which the resistance variable memory apparatus 200 writes data to the resistance variable element 210, the write pulse generating/write control circuit 240 initially receives write data from outside. The write pulse generating/write control circuit 240 determines whether the write data is "1" or "0." When the resistance variable memory apparatus 200 does not write data, Vpg1 is set to VDD, and Vng1 is set to a ground voltage (GND=0).

In a case where the write data is "0" (the resistance variable element 110 is switched to the high-resistance state), the operation similar to that of Embodiment 1 is performed and detailed description thereof is omitted. Since the write operation is performed as in Embodiment 1, the event that the element 210 is inadvertently switched to the low-resistance state ("1") does not occur. In this operation, under control of the write pulse generating/write control circuit 240, Vpg' is caused to be, for example, VDD or larger, Vng' is caused to be, for example, GND (=0) or smaller, and the nMOS 250 and the pMOS 260 are caused to be placed in a completely OFF-state. Therefore, the circuit operation is not affected by the nMOS 250 and the pMOS 260.

In a case where the write data is "1" (the resistance variable element 110 is switched to the low-resistance state), the pMOS 230 is caused to be placed in a completely OFF-state and the other MOSs are caused to be placed in a completely ON-state under control of the write pulse generating/write control circuit 240 for a predetermined time. With such an operation, a desired electric pulse is applied to the resistance variable element 210.

Figure 16:
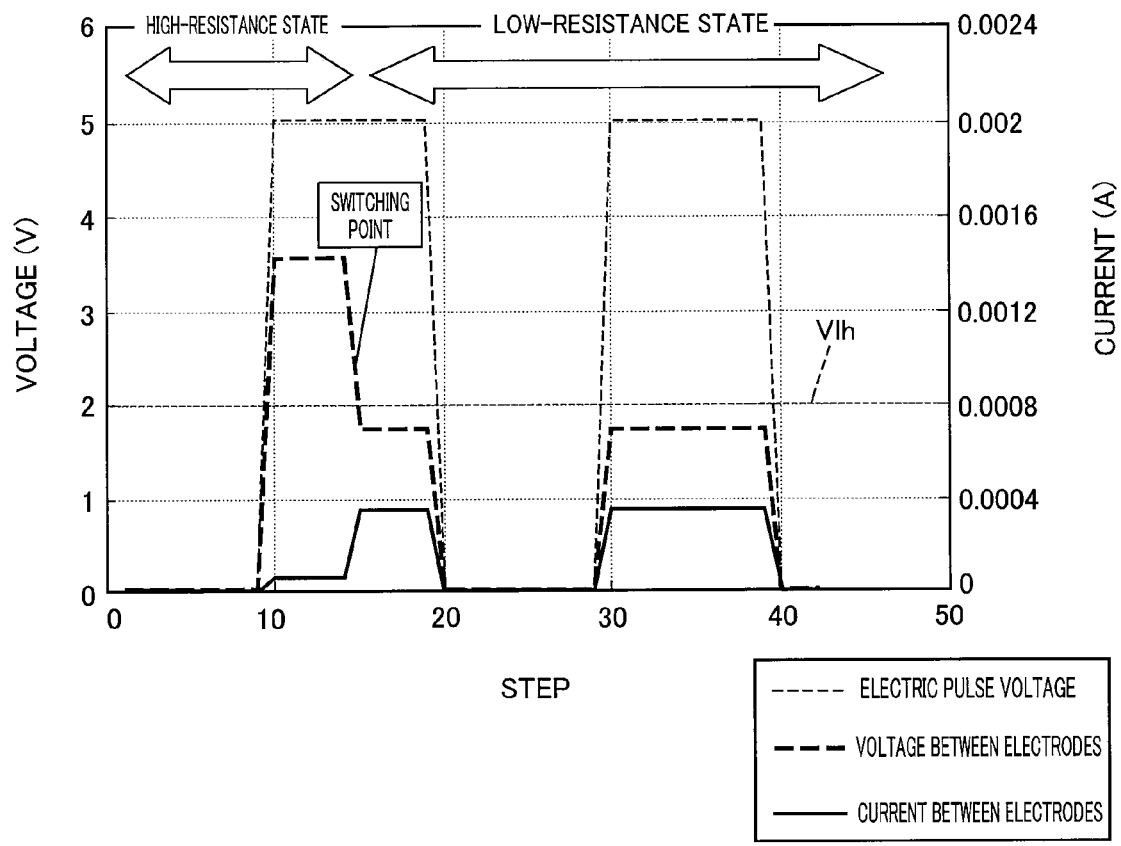
FIG. 16 is a graph schematically showing a change in an electric pulse voltage (Vpd'), a change in a current between FIG. 17 is a graph showing a relationship between an electric resistance Rh and a voltage between electrodes in a case where other parameters are fixed, in Embodiment 1 and Embodiment 2.

FIG. 16 is a graph schematically showing a change in the electric pulse voltage (Vpd'), a change in the current between electrodes, and a change in the voltage between electrodes (Vns) in a case where the resistance variable element is switched from the high-resistance state to the low-resistance state in Embodiment 2 of the present invention. A horizontal axis indicates time. But, a time unit may be varied depending on a response speed of the resistance variable element 210. For this reason, the time is normalized and is expressed as a step number. As shown in the left side of FIG. 16, when an electric pulse with which Vpd' becomes 5V is applied to the resistance variable element 210 in the high-resistance state, a voltage (Vhl=3.5V) required to switch the resistance variable element 210 to the low-resistance state is applied to the resistance variable element 210, and the resistance variable element 210 is switched to the low-resistance state at a "switching point." As can be seen from FIG. 16, after the resistance variable element 210 has been switched to the low-resistance sate, the voltage between electrodes (voltage of reference node) is restricted to about 1.75V, and the current between electrodes is restricted to 350 µA even when the electric pulse is being still output. Since the voltage between electrodes does not exceed a voltage (Vlh=2.0V) required to switch the resistance variable element 210 from the low-resistance state to the high-resistance state, the event that the resistance variable element 210 is inadvertently switched to the high-resistance state does not occur. As shown in the right side of FIG. 16, when an electric pulse with which Vpd' becomes 5V is applied to the resistance variable element 210 in the low-resistance state, the voltage between electrodes is restricted to about 1.75V, and the current between electrodes is restricted to 350 µA. Since the voltage between electrodes does not exceed the voltage (Vlh=2.0V) required to switch the resistance variable element 210 from the low-resistance state to the high-resistance state, the event that the resistance variable element 210 is inadvertently switched to the high-resistance state does not occur.

[Variation in Voltage Between Electrodes in a Case where Rh is Non-uniform]

The resistance variable elements have certain non-uniformity in electric resistance between electrodes (Rh) corresponding to the high-resistance state, because of an error in the manufacture process, etc. In particular, in a case where numerous resistance variable elements are arranged in an array form to provide a memory apparatus having a larger capacity, it is necessary to prevent the incorrect operation which is caused by the non-uniformity. This embodiment has an advantage that the electric resistance between electrodes can be stabilized even when Rh is non-uniform. Hereinafter, this will be specifically described.

Figure 17:
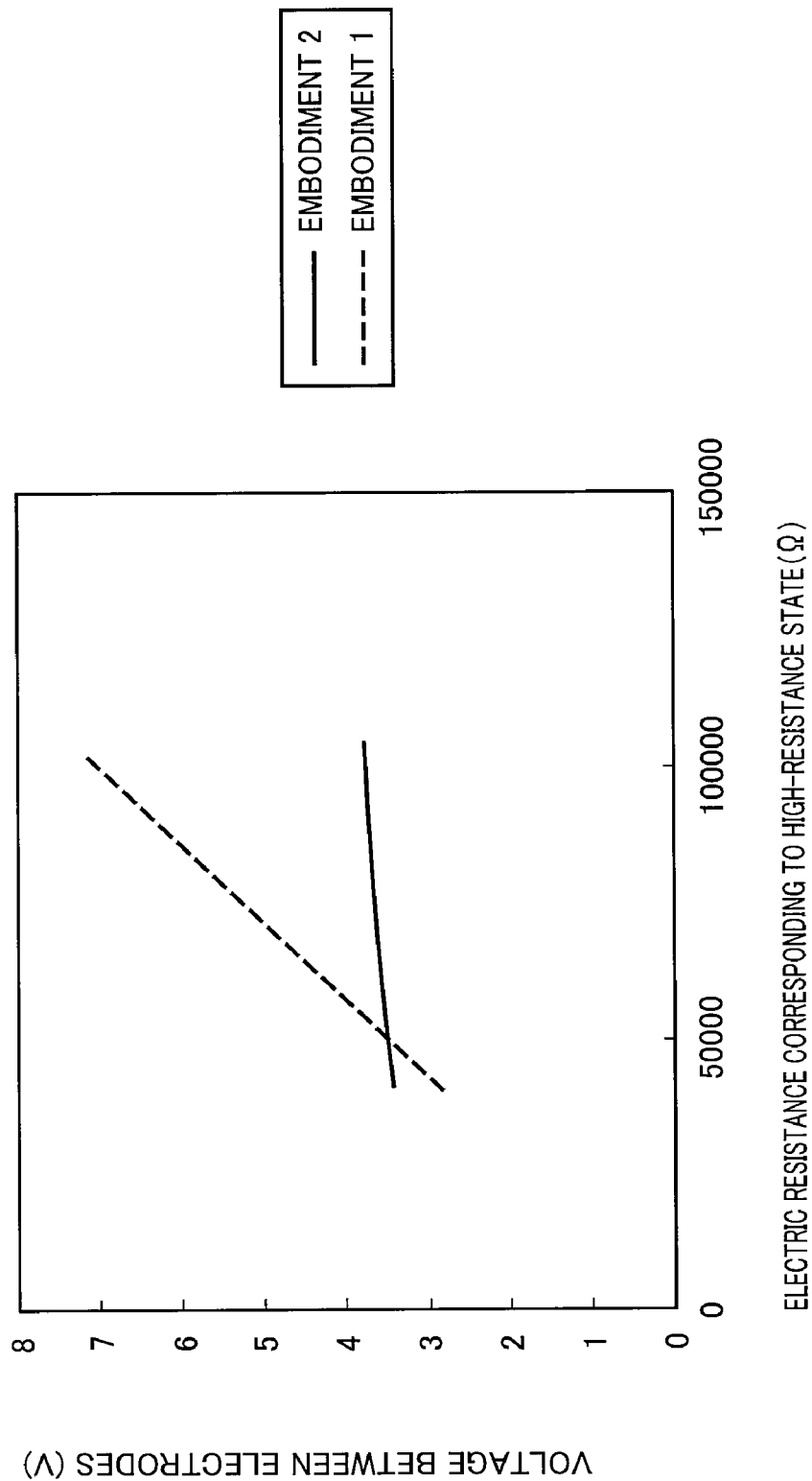

FIG. 17 is a graph showing a relationship between the electric resistance between electrodes (Rh) and the voltage between electrodes with other parameters being fixed in Embodiment 1 and in Embodiment 2. It should be noted that the configuration is set so that the voltage between electrodes is 3.5V when Rh is 50 kΩ. As shown in FIG. 17, a change in the voltage between electrodes which occurs when Rh changes is smaller in Embodiment 2 than in Embodiment 1. In Embodiment 1, there is a relatively great variation in the voltage between electrodes because of the fact that the voltage between electrodes is determined by a product of the electric resistance between electrodes and the current between electrodes. In contrast, in Embodiment 2, since the voltage between electrodes is determined by a voltage division relationship formed by Rs, Rp and Rram, a variation in the voltage between electrodes due to the variation in Rh is lessened. From this result, it can be seen that the variation in the voltage between electrodes with respect to the variation in Rh is lessened in the configuration of this embodiment. Therefore, even if there is a variation in the electric resistances of the resistance variable elements because of the non-uniformity in manufacture or operation, an absolute value of the voltage between electrodes does not significantly change when writing is performed to attain the low-resistance state, and a substantially desired voltage (voltage which is necessary and sufficient to switch the element to the low-resistance state) can be maintained stably.

[Advantage]

In the resistance variable memory apparatus 200 of this embodiment, the advantage similar to that of Embodiment 1 is achieved.

In addition, in the resistance variable memory apparatus 200, even if there is a variation in the electric resistances of the resistance variable elements because of the non-uniformity or the like in manufacture or operation, the voltage between electrodes can be maintained stably at a desired value when writing is performed to attain the low-resistance state. Since the resistance variable element is less likely to be subjected to an unnecessary stress, a life of the element is prolonged. That is, in this embodiment, reliability of the resistance variable element is further improved.

Embodiment 3

[Configuration]

Figure 18:
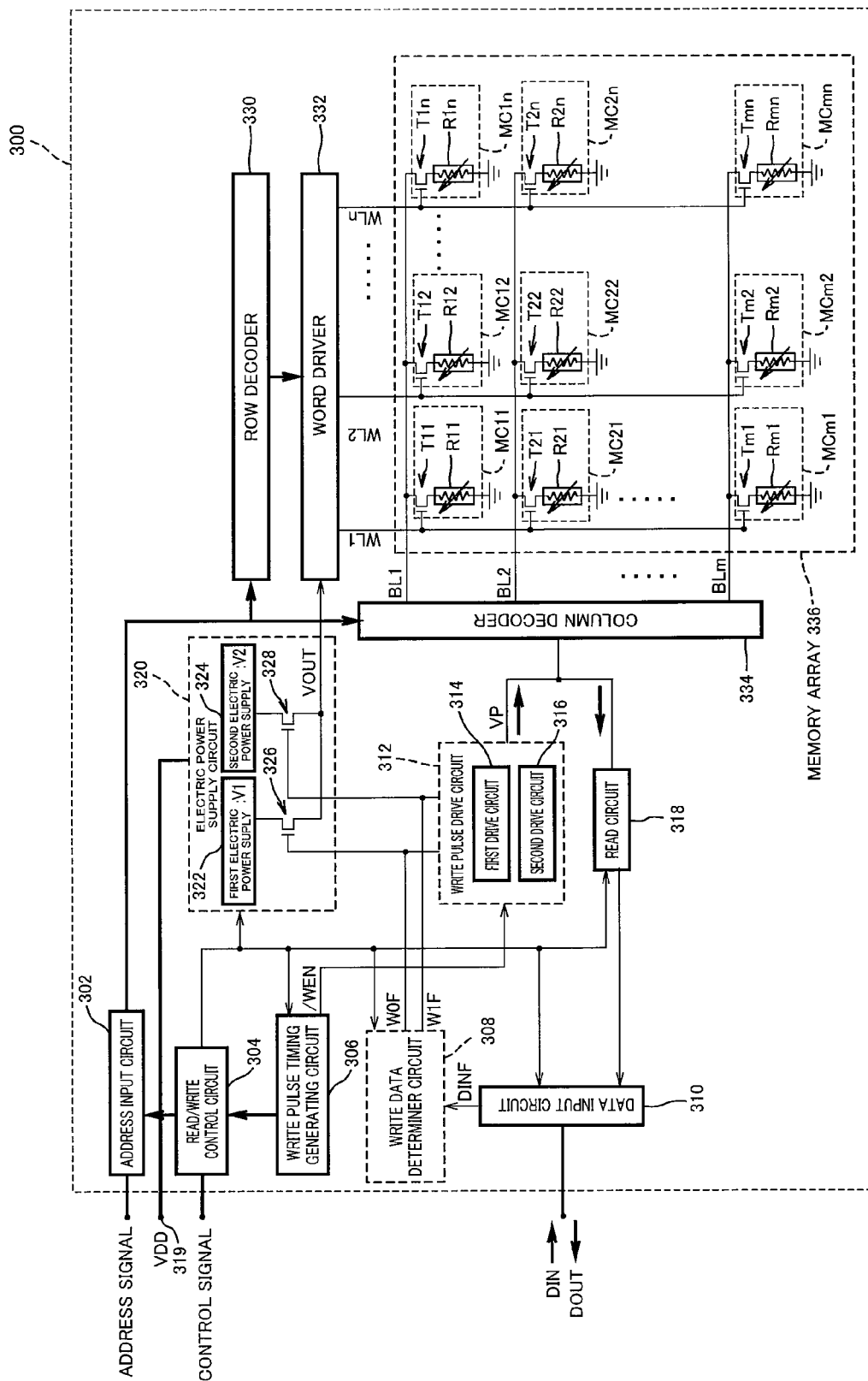
FIG. 18 is a block diagram showing an example of a schematic configuration of a resistance variable memory apparatus according to Embodiment 3 of the present invention.

FIG. 18 is a block diagram showing an example of a schematic configuration of a resistance variable memory apparatus according to Embodiment 3 of the present invention. Hereinafter, the configuration of a resistance variable memory apparatus 300 of this embodiment will be described with reference to FIG. 18.

As shown in FIG. 18, the resistance variable memory apparatus 300 comprises an address input circuit 302, a read/write control circuit 304, a write pulse timing generating circuit 306, a write data determiner circuit 308, a data input/output circuit 310, a write pulse drive circuit 312 (current restricting circuit), a read circuit 318, an electric power supply circuit 320, a row decoder 330, a word driver 332, a column decoder 334, and a memory array 336.

The write pulse drive circuit 312 includes a first drive circuit 314 (current capacity: Ia) and a second drive circuit 316 (current capacity: Ib).

The electric power supply circuit 320 includes a first electric power supply 322 (voltage: V1), a second electric power supply 324 (voltage: V2), a first transistor 326, and a second transistor 328.

The memory cell array 336 includes n word lines WL1, WL2, WLn (n: natural number) which are formed to extend in parallel with each other within a plane parallel to a main surface of the substrate (not shown) and are respectively connected to the word driver 332, m bit lines BL1, BL2, . . . BLm (m: natural number) which are formed within a plane parallel to the main surface of the substrate so as to extend in parallel with each other and so as to three-dimensionally cross the word lines as viewed from a direction perpendicular to the main surface and are respectively connected to the column decoder 334, and memory cells MC11, MC21, . . . MCmn which are provided to respectively correspond to three-dimensional cross points between the word lines and the bit lines.

The memory cell MC11 includes a selection transistor T11 (voltage restricting active element) and a resistance variable element R11. One main terminal (first main terminal: drain) of the selection transistor T11 is connected to the bit line BL1 forming the three-dimensional cross point corresponding to the memory cell MC11, the control terminal (gate) of the selection transistor T11 is connected to the word line WL1 forming the three-dimensional cross point corresponding to the memory cell MC11, the other main terminal (second main terminal: source) of the selection transistor is connected to the one terminal (first terminal) of the resistance variable element R11, and the other terminal (second terminal) of the resistance variable element R11 is electrically grounded. In the same manner, each of the memory cells MC21, MC22, MCmn includes a selection transistor Tij (voltage restricting active element) and a resistance variable element Rij, which are connected to the bit line and to the word line, and are electrically grounded.

The selection transistor T11 is selectively switched in level of a gate voltage according to the write data ("0" or "1") so as to serve as a voltage restricting circuit optimal to the associated write operation. Since the selection transistor T11 is similar to the nMOS 120 of Embodiment 1 and the method for allowing the selection transistor T11 to serve as the voltage restricting circuit is also similar to that of Embodiment 1, detailed description thereof is omitted. The configuration and characteristic of the resistance variable element R11 are similar to those of the resistance variable element 110 of Embodiment 1 and will not be described in detail.

The address input circuit 302 receives an address signal from outside, and outputs address information to the row decoder 330 and to the column decoder 334 respectively based on a timing signal received as an input from the write pulse/timing generating circuit 306 via the read/write control circuit 304.

The read/write control circuit 304 receives a control signal from outside, and outputs an internal control signal to the write pulse timing generating circuit 306, the write data determiner circuit 308, the data input/output circuit 310, the read circuit 318, and the electric power supply circuit 320, based on the timing signal received from the write pulse/timing generating circuit 306.

The write pulse/timing generating circuit 306 outputs the timing signal to the read/write control circuit 304, receives the internal control signal from the read/write control circuit 304, and outputs a write timing signal (/WEN) to the write pulse drive circuit 312.

The data input/output circuit 310 receives the internal control signal from the read/write control circuit 304, receives the input data (DIN) from outside, outputs input data flag (DINF) to the write data determiner circuit 308, receives read data from the read circuit 318, and outputs it as output data (DOUT) to outside.

The write data determiner circuit 308 receives the internal control signal from the read/write control circuit 304 and the input data flag (DINF) from the data input/output circuit 310, determines whether the write data is "0" or "1," and outputs data "0" write flag signal (W0F) and data "1" write flag signal (W1F) as determination result to the write pulse drive circuit 312 and to the electric power supply circuit 320. To be specific, when the write data is "0," W0F is caused to become a high voltage (H) and W1F is caused to become a low voltage (L), while when the write data is "1," W0F is caused to become a low voltage (L) and W1F is caused to become a high voltage (H).

The write pulse drive circuit 312 selectively connects the first drive circuit 314 (current capacity: Ia) or the second drive circuit 316 (current capacity: Ib) to the column decoder 334 according to the write timing signal (/WEN) received from the write pulse/timing generating circuit 306, the data "0" write flag signal (W0F) and the data "1" write flag signal (W1F) which are received from the write data determiner circuit 308 (the detail will be described later). The voltage of the electric pulse output from the write pulse drive circuit 312 is hereinafter expressed as VP.

The read circuit 318 receives the internal control signal from the read/write control circuit 304, and detects the magnitude of a current flowing in the selected memory cell MCij, and determines whether the resistance variable element Rij included in the memory cell MCij is in the high-resistance state or in the low-resistance state, in the read operation. The result of determination is output to the data input/output circuit 310.

The electric power supply circuit 320 receives the voltage VDD from an external electric power supply via an external electric power supply input terminal 319, receives the internal control signal from the read/write control circuit 304, and selectively connects the first electric power supply 322 (voltage: V1) or the second electric power supply 324 (voltage: V2) to the word driver 332 according to the data "0" write flag signal (W0F) and the data "1" write flag signal (W1F) received from the write data determiner circuit 308. To be specific, when W0F is ON (high voltage) and W1F is OFF (low voltage), the first transistor 326 connected to the first electric power supply 322 becomes an ON-state whereas the second transistor 328 connected to the second electric power supply 324 becomes an OFF-state and V1 is output to the word driver 332. On the other hand, when W0F is OFF (low voltage) and W1F is ON (high voltage), the first transistor 326 connected to the first electric power supply 322 becomes an OFF-state whereas the second transistor 328 connected to the second electric power supply 324 becomes an ON-state and V2 is output to the word driver 332. The voltage (V1 or V2) output from the electric power supply circuit 320 is hereinafter expressed as VOUT.

The row decoder 330 controls the word driver 332 based on the address information (word line number) received from the address input circuit 302 and selects a specified word line WLj.

The word driver 332 outputs to the selected word line WLj, the voltage VOUT received from the electric power supply circuit 320 based on the control of the row decoder 330.

The column decoder 334 selects a specified bit line BLi based on the address information (bit line number) received from the address input circuit 302.

In this embodiment, using the address input circuit 302, the read/write control circuit 304, the write pulse/timing generating circuit 306, the write data determiner circuit 308, the data input/output circuit 310, the write pulse drive circuit 312, the read circuit 318, and the electric power supply circuit 320, functions of the controller (output of the write pulse, control of the voltage restricting active element and the current restricting active element, selection of the word line and the bit line, etc) are implemented.

Figure 19:
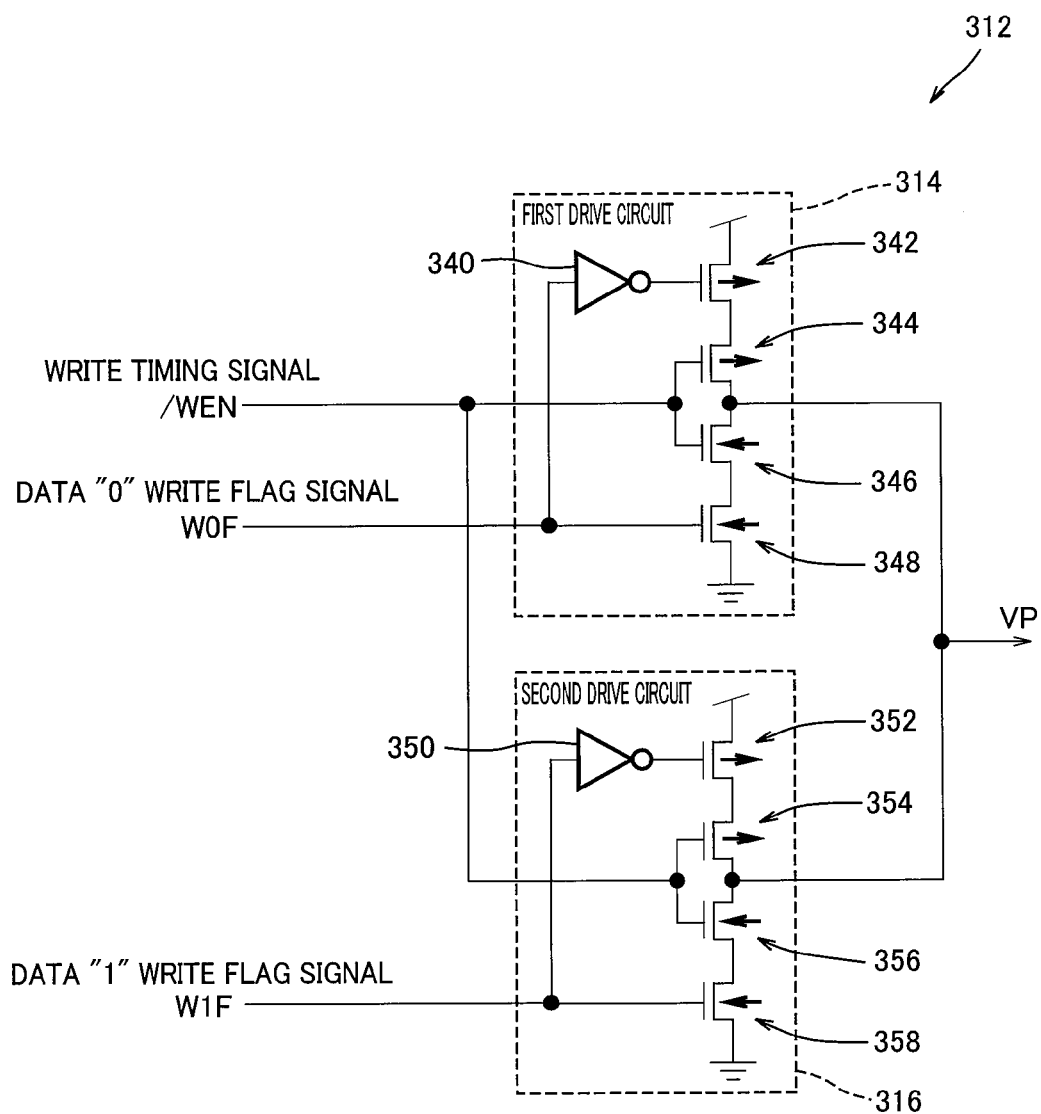
FIG. 19 is a circuit diagram showing an example of a specific configuration of a write pulse drive circuit 312 in Embodiment 3 of the present invention.

FIG. 19 is a circuit diagram showing an example of a specific configuration of the write pulse drive circuit 312 in Embodiment 3 of the present invention. As shown in FIG. 19, the write pulse drive circuit 312 includes the first drive circuit 314 including an inverter 340, a pMOS 342 (first current restricting active element), a pMOS 344, a nMOS 346, and a nMOS 348, and the second drive circuit 316 including an inverter 350, a pMOS 352 (second current restricting active element), a pMOS 354, a nMOS 356, and a nMOS 358.

In the first drive circuit 314, the pMOS 342, the pMOS 344, the nMOS 346 and the nMOS 348 are connected in series in this order via main terminals (drains or sources) thereof, forming a current path. In the second drive circuit 316, the pMOS 352, the pMOS 354, the nMOS 356, and nMOS 358 are connected in series in this order via main terminals (sources or drains) thereof, forming a current path.

One of the two main terminals of the pMOS 342 which is not connected to the pMOS 344 is connected to the electric power supply (e.g., external electric power supply of the voltage VDD). One of the two main terminals of the pMOS 352 which is not connected to the pMOS 354 is connected to the electric power supply (e.g., external electric power supply of the voltage VDD).

One of the two main terminals of the nMOS 348 which is not connected to the nMOS 346 is electrically grounded. One of the two main terminals of the nMOS 358 which is not connected to the nMOS 356 is electrically grounded.

The main terminal of the pMOS 344 and the main terminal of the nMOS 346 by which the pMOS 344 and the nMOS 346 are connected to each other are respectively connected to the column decoder 334, and the main terminal of the pMOS 354 and the main terminal of the nMOS 356 by which the pMOS 354 and the nMOS 356 are connected to each other are respectively connected to the column decoder 334.

The write timing signal (/WEN) output from the write pulse/timing generating circuit 306 is input to the control terminal (gate) of the pMOS 344, the control terminal (gate) of the nMOS 346, the control terminal (gate) of the pMOS 354, and the control terminal (gate) of the nMOS 356.

The data "0" write flag signal (W0F) output from the write data determiner circuit 308 is input to the control terminal (gate) of the nMOS 348 and input to a control terminal (gate) of the pMOS 342 via the inverter 340.

The data "1" write flag signal (W1F) output from the write data determiner circuit 308 is input to the control terminal (gate) of the nMOS 358 and input to the control terminal (gate) of the pMOS 352 via the inverter 350.

The gate widths of the pMOS 342 and the pMOS 344 and the like are set so that the current capacity becomes Ia when the output voltage (VP) is Vlh in a case where the first drive circuit 314 is activated to enable the write pulse drive circuit 312 to serve as a current restricting circuit. In addition, the gate widths of the pMOS 352 and the pMOS 354 and the like are set so that the current capacity becomes smaller than Ilh when the output voltage (VP) is Vlh and the current capacity becomes Ib when the output voltage (VP) is Vhl in a case where the second drive circuit 316 is activated. A method for allowing the pMOS 342, the pMOS 344, the pMOS 352, and the pMOS 354 to serve as the current restricting active elements, by such a control, is similar to that of Embodiment 1 and will not be described in detail.

In the above described configuration, only when /WEN (negative polarity) is OFF (low voltage) and W0F is ON (high voltage), the pMOS 342 and the pMOS 344 become an ON-state, other paths are disconnected, and the electric power supply connected to the pMOS 342 is connected to a specified bit line BLi via the column decoder 334. At this time, the pMOS 344 is placed in a completely electrically-conductive state, and therefore the current capacity of the write pulse drive circuit 312 is determined by the current capacity (Ia) of the pMOS 342 and the pMOS 344.

Only when /WEN (negative polarity) is OFF (low voltage) and W1F is ON (high voltage), the pMOS 352 and the pMOS 354 become an ON-state, other paths are disconnected, and the electric power supply connected to the pMOS 352 is connected to a specified bit line BLi via the column decoder 334. At this time, the pMOS 354 is placed in a completely electrically-conductive state, and therefore the current capacity of the write pulse drive circuit 312 is determined by the current capacity (Ib) of the pMOS 352 and the pMOS 354.

Figure 20:
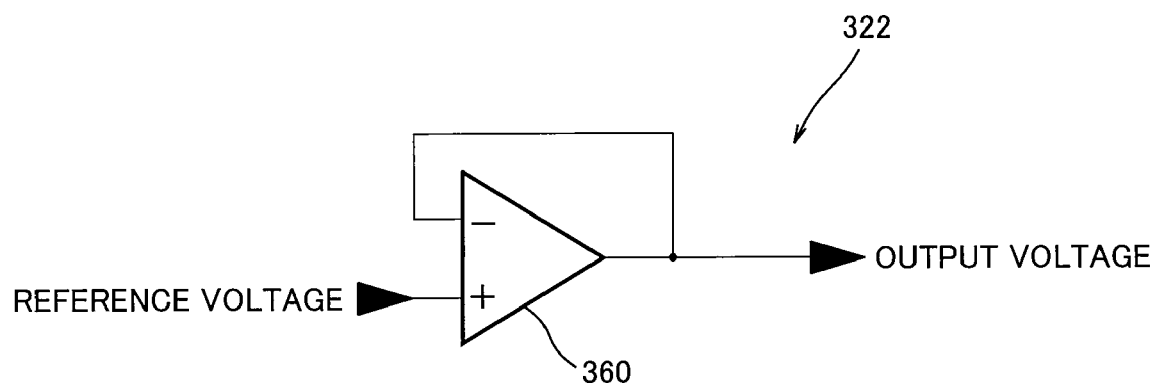
FIG. 20 is a circuit diagram showing an example of a specific configuration of a first electric power supply 322 in Embodiment 3 of the present invention.

FIG. 20 is a circuit diagram showing an example of a specific configuration of the first electric power supply 322 in Embodiment 3 of the present invention. As shown in FIG. 20, the first electric power supply 322 includes an operational amplifier 360 and is configured such that the reference voltage (V1) is input to a plus input terminal of the operational amplifier 360, and the output voltage of the operational amplifier 360 is fed back to a minus input terminal thereof. In such a configuration, a constant voltage electric power supply using the reference voltage (V1) as the output voltage is implemented. The second electric power supply 324 may be configured in the same manner except that the reference voltage is V2. The reference voltage may be controlled at an optimal voltage of lots or chips in a manufacture process by a laser trimming fuse or an electric fuse means which is commonly used in the manufacture steps of the conventional semiconductor apparatus.

[Operation]

Figure 21:
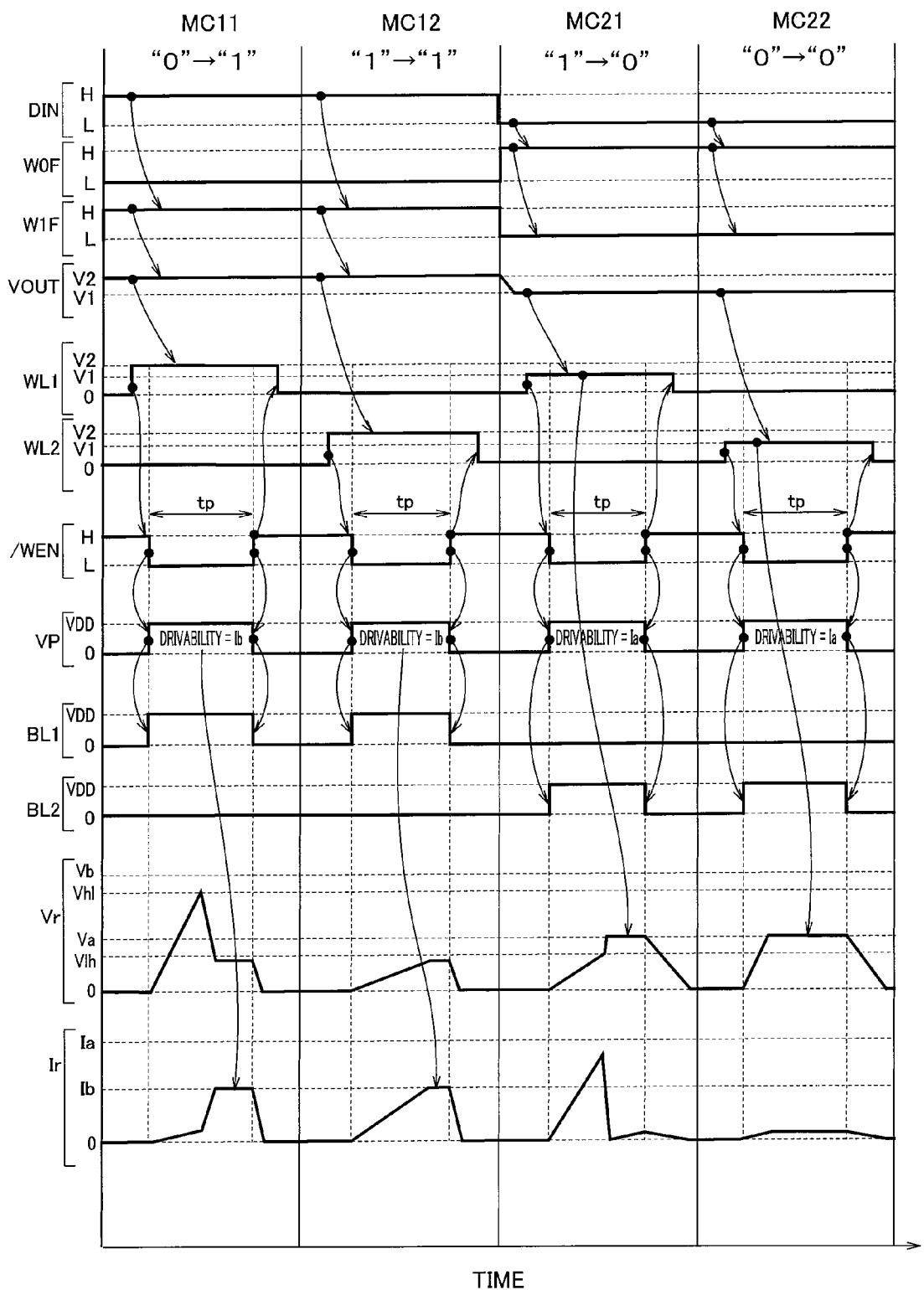
FIG. 21 is an example of a timing chart showing values of signals, a voltage between electrodes (Vr), and a current between electrodes (Ir) in a write operation in Embodiment 3 of the present invention.

FIG. 21 is an example of a timing chart showing values of signals, a voltage between electrodes (Vr), and a current between electrodes (Ir) in a write operation in Embodiment 3 of the present invention. Hereinafter, the operation of the resistance variable memory apparatus 300 will be described with reference to FIGS. 21 and 18.

Hereinbelow, by way of example, a description will be given of a case where "0," "1," "1," and "0" have been written to the memory cell MC11, the memory cell MC12, the memory cell MC21, and the memory cell MC22, respectively, before the write operation, and "1," "1," "0," and "0" are written to the memory cell MC11, the memory cell MC12, the memory cell MC21, and the memory cell MC22, respectively, in the write operation. It is supposed that "0" corresponds to the high-resistance state and "1" corresponds to the low-resistance state, as described above, but the correspondence may be reversed.

1. Example in which Rewriting is Performed to Switch Memory Cell MC11 from "0" to "1"

An address signal indicating the memory cell MC11 is input to the address input circuit 302 from outside. The address input circuit 302 outputs address information (1 as row number and 1 as column number) to the row decoder 330 and to the column decoder 334 respectively based on the timing signal received from the write pulse/timing generating circuit 306. The row decoder 330 controls the word driver 332 based on the row number received and selects the first word line WL1. The column decoder 334 selects the first bit line BL1 based on the column number received. In more detail, in response to the selection of the word line, rising of the write timing signal (/WEN) and selection of the bit line are performed. Also, after falling of the write timing signal (/WEN) and the selection of the bit line are ended, the selection of the word line is ended. Hereinafter, in respective write operations, the pulses are output, etc., at similar timings and in similar order. The timings and order associated with the respective signals are indicated by arrows in FIG. 21.

At the same time, "1" is input to the data input/output circuit 310 as DIN from outside. The data input/output circuit 310 outputs "1" to the write data determiner circuit 308 as input data flag (DINF). Based on the DINF received, the write data determiner circuit 308 determines whether the write data is "1" or "0." Since the write data is "1" in this case, the data "0" write flag signal (W0F) is caused to become a low voltage (L) and the data "1" write flag signal (W1F) is caused to become a high voltage (H). The electric power supply circuit 320 outputs a voltage V2 as VOUT to the word driver 332 based on W0F and W1F received. As a result, the electric potential of the word line WL1 becomes V2 but the electric potentials of the other word lines become zero.

At the same time, the read/write control circuit 304 outputs the internal control signal based on a timing signal received from EleSetPositionEleSetPosition write pulse/timing generating circuit 306 and the control signal received from outside. The write pulse/timing generating circuit 306 outputs, as a write timing signal (/WEN), an electric pulse (in this case, square wave) having a predetermined pulse width tp required to write data to the resistance variable element Rij, based on the internal control signal received and in synchronization with a write start timing. /WEN has a negative polarity. /WEN is at a high voltage (H) in a normal state and becomes a low voltage (L) only when writing is performed. When /WEN becomes L, the write pulse drive circuit 312 outputs an electric pulse. Since W0F is L and W1F is H in this case, the second drive circuit 316 is selected in the write pulse drive circuit 312, and the current capacity becomes Ib. VP is input to the column decoder 334 and the electric pulse of the voltage VP is applied to the selected bit line BL1. The waveform of VP is similar to that of Vr. However, for the sake of explanation, VP is drawn as a simple square wave (waveform in the case where the resistance and the like of the resistance variable element are neglected) (hereinafter the same occurs in the waveform of VP). The electric potentials of the other bit lines become zero.

In such an operation, V2 is applied to the control terminal (gate) of the selection transistor T11 of the memory cell MC11, and in a following tp period, VDD is applied to the main terminal (drain or source) of the selection transistor T11 which is connected to the bit line BL1. The selection transistor T11 serves as a voltage restricting circuit such that the upper limit of the voltage between electrodes of the resistance variable element R11 becomes Vb which is lower than V2 by a threshold voltage Vnt of the selection transistor T11. Likewise, the write pulse drive circuit 312 serves as a current restricting circuit for restricting the current between electrodes of the resistance variable element R11 becomes Ib or lower. Therefore, through the line shown in FIG. 10, the resistance variable element R11 is switched from the high-resistance state to the low-resistance state.

In the above operation, since the upper limit value of the current between electrodes of the resistance variable element R11 is set to Ib, the voltage between electrodes of the resistance variable element R11 in the low-resistance state is suppressed to a value smaller than the value of Vlh, regardless of the output voltage values of the bit line and the word line. Therefore, the event that the resistance variable element R11 is inadvertently switched again to the high-resistance state ("0") after the element R11 has been switched to the low-resistance state ("1") does not occur. In addition, since the upper limit is set in the current between electrodes, breakdown of the resistance variable element R11 due to an excess current does not occur.

2. Example in which "1" is Overwritten to Memory Cell MC12

An address signal indicating the memory cell MC12 is input to the address input circuit 302 from outside. The address input circuit 302 outputs address information (2 as row number and 1 as column number) to the row decoder 330 and the column decoder 334 respectively based on the timing signal received from the write pulse/timing generating circuit 306. The row decoder 330 controls the word driver 332 based on the row number received and selects the second word line WL2. The column decoder 334 selects the first bit line BL1 based on the column number received.

Since a control method of the electric potential of the word line and a control method of the electric potential of the bit line are similar to those in writing for the memory cell MC11, they will not be described repetitively.

In such an operation, V2 is applied to the control terminal (gate) of the selection transistor T12 of the memory cell MC12, and the electric pulse of voltage VP is applied to the main terminal (drain or source) of the selection transistor T12 which is connected to the bit line BL1. The selection transistor T12 serves as a voltage restricting circuit such that the upper limit of the voltage between electrodes of the resistance variable element R12 becomes Vb which is lower than V2 by a threshold voltage Vnt of the selection transistor T12. Likewise, the write pulse drive circuit 312 serves as a current restricting circuit and restricts the current between electrodes of the resistance variable element R12 becomes Ib or lower, because the second drive circuit 316 is selected in the write pulse drive circuit 312. Therefore, as shown in FIG. 11, the resistance variable element R12 maintains the low-resistance state and will not change.

In the above operation, since the upper limit value of the current between electrodes of the resistance variable element R12 is set to Ib, the voltage between electrodes of the resistance variable element R12 in the low-resistance state is suppressed to a value smaller than the value of Vlh regardless of the output voltage values of the bit line and the word line. Therefore, the event that the resistance variable element R12 is inadvertently switched to the high-resistance state ("0") does not occur. In addition, since the upper limit is set in the current between electrodes, breakdown of the resistance variable element R12 due to an excess current does not occur.

3. Example in which Rewriting is Performed to Switch Memory Cell MC21 from "1" to "0"

An address signal indicating the memory cell MC21 is input to the address input circuit 302 from outside. The address input circuit 302 outputs the address information (1 as row number and 2 as column number) to the row decoder 330 and to the column decoder 334 respectively based on the timing signal received from the write pulse/timing generating circuit 306. The row decoder 330 controls the word driver 332 based on the row number received and selects the first word line WL1. The column decoder 334 selects the second bit line BL2 based on the column number received.

At the same time, "0" is input to the data input/output circuit 310 as DIN from outside. The data input/output circuit 310 outputs "0" to the write data determiner circuit 308 as input data flag (DINF). Based on the DINF received, the write data determiner circuit 308 determines whether the write data is "1" or "0." Since the write data is "0" in this case, the data "0" write flag signal (W0F) is caused to become a high voltage (H) and the data "1" write flag signal (W1F) is caused to become a low voltage (L). The electric power supply circuit 320 outputs a voltage V1 as VOUT to the word driver 332 based on W0F and W1F received. As a result, the electric potential of the word line WL1 becomes V1 but the electric potentials of the other word lines become zero.

At the same time, the read/write control circuit 304 outputs the internal control signal based on a timing signal received from the write pulse/timing generating circuit 306 and the control signal received from outside. The write pulse/timing generating circuit 306 outputs, as a write timing signal (/WEN), an electric pulse (in this case, square wave) having a predetermined pulse width tp required to write data to the resistance variable element Rij, based on the internal control signal received and in synchronization with the write start timing. /WEN has a negative polarity. /WEN is at a high voltage (H) in a normal state and becomes a low voltage (L) only when writing is performed. When /WEN becomes L, the write pulse drive circuit 312 outputs an electric pulse. Since the W0F is H and the W1F is L in this case, the first drive circuit 314 is selected in the write pulse drive circuit 312, and the current capacity becomes Ia. VP is input to the column decoder 334 and the electric pulse of the voltage VP is applied to the selected bit line BL2. The electric potentials of the other bit lines become zero.

In such an operation, V1 is applied to the control terminal (gate) of the selection transistor T21 of the memory cell MC21, and in a following period of tp, VDD is applied to the main terminal (drain or source) of the selection transistor T21 which is connected to the bit line BL2. The selection transistor T21 serves as a voltage restricting circuit such that the upper limit of the voltage between electrodes of the resistance variable element R21 becomes Va which is lower than V1 by a threshold voltage Vnt of the selection transistor T21. Likewise, the write pulse drive circuit 312 serves as a current restricting circuit for restricting the current between electrodes of the resistance variable element R21 becomes Ia or less, whereas the current supplied by the write pulse drive circuit 312 can reach Ilh. Therefore, through the line shown in FIG. 12, the resistance variable element R21 is switched from the low-resistance state to the high-resistance state.

In the above operation, since the upper limit value of the voltage between electrodes of the resistance variable element R21 is set to Va, the voltage between electrodes of the resistance variable element R21 in the high-resistance state is suppressed to a value smaller than the value of Vhl, regardless of the output voltage values of the bit line and the word line. Therefore, the event that the resistance variable element R21 is inadvertently switched to the low-resistance state ("1") again after the element R21 has been switched to the high-resistance state ("0") does not occur.

4. Example in which "0" is Overwritten to Memory Cell MC22

An address signal indicating the memory cell MC22 is input to the address input circuit 302 from outside. The address input circuit 302 outputs address information (2 as row number and 2 as column number) to the row decoder 330 and to the column decoder 334, respectively. The row decoder 330 controls the word driver 332 based on the row number received and selects the second word line WL2. The column decoder 334 selects the second bit line BL2 based on the column number received.

Since a control method of the electric potential of the word line and a control method of the electric potential of the bit line are similar to those in writing to the memory cell MC21, they will not be described repetitively.

In such an operation, V1 is applied to the control terminal (gate) of the selection transistor T22 of the memory cell MC22, and the electric pulse of voltage VP is applied to the main terminal (drain or source) of the selection transistor T22 which is connected to the bit line BL2. The selection transistor T22 serves as a voltage restricting circuit such that the upper limit of the voltage between electrodes of the resistance variable element R22 becomes Va which is lower than V1 by a threshold voltage Vnt of the selection transistor T22. Therefore, as shown in FIG. 13, the resistance variable element R22 maintains the high-resistance state and will not change, although the first drive circuit 314 having a current capacity of Ihl or larger is selected in the write pulse drive circuit 312.

In the above operation, since the upper limit value of the voltage between electrodes of the resistance variable element R22 is set to Va, the voltage between electrodes of the resistance variable element R22 in the high-resistance state is suppressed to a value smaller than Vhl. Therefore, the event that the resistance variable element R22 is inadvertently switched to the low-resistance state ("1") after the element R22 has been switched to the high-resistance state ("0") does not occur.

Since a well-known configuration and method, such as the use of a current comparator circuit as the read circuit 318, may be used for the read operation, a detailed description of the read operation is omitted.

[Advantage]

According to the resistance variable memory apparatus 300 of this embodiment, it is also possible to provide a resistance variable memory apparatus having a larger capacity in which plural resistance variable elements are integrated in an array form while achieving the advantages similar to those of Embodiment 1.

[Modification 1]

Figure 22:
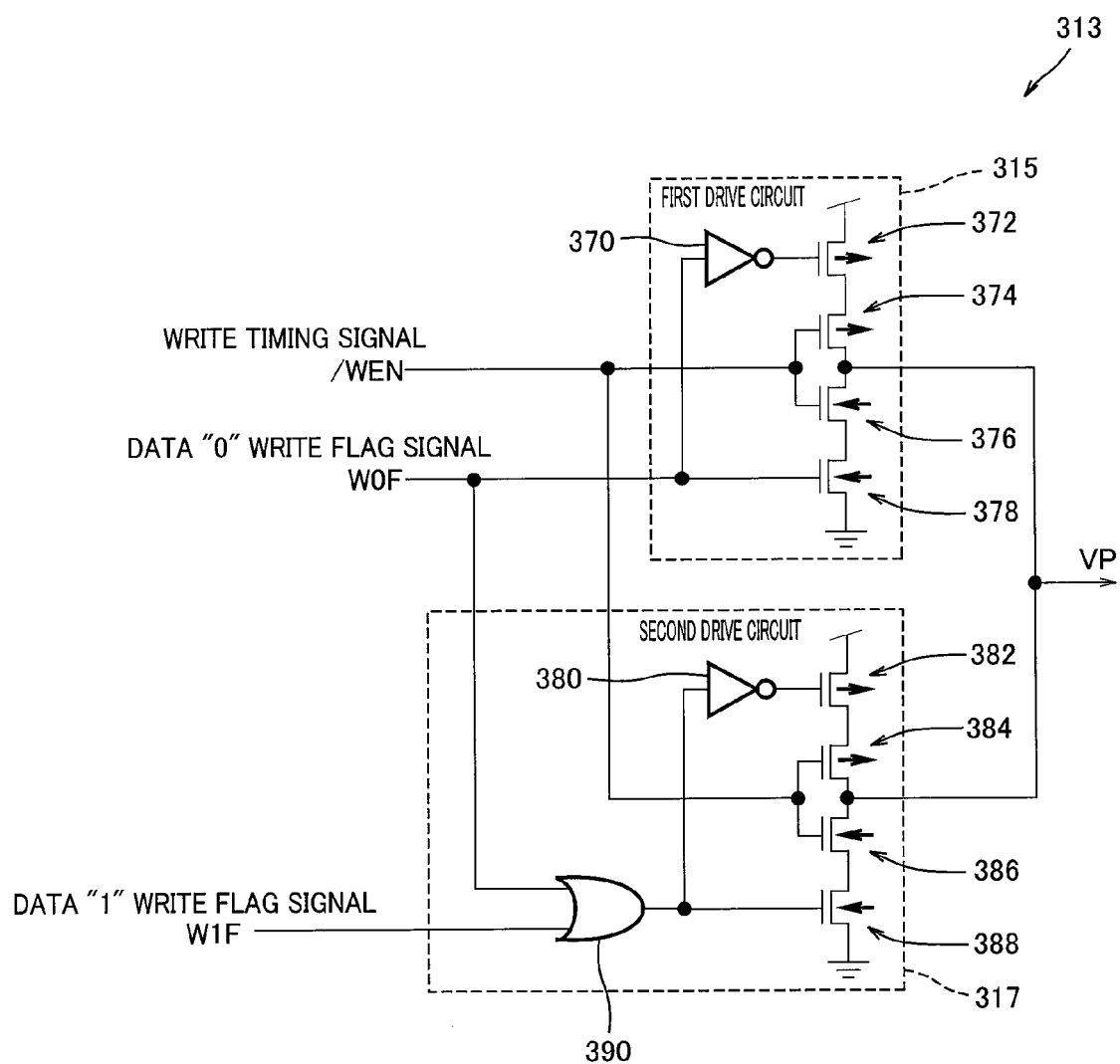
FIG. 22 is a circuit diagram (corresponding to FIG. 19) showing an example of a specific configuration of a write pulse drive circuit 313 in modification 1 of Embodiment 3 of the present invention.

FIG. 22 is a circuit diagram (corresponding to FIG. 19) showing an example of a specific configuration of the write pulse drive circuit 313 in modification 1 of Embodiment 3 of the present invention. As shown in FIG. 22, the write pulse drive circuit 313 of this modification includes a first drive circuit 315 including an inverter 370, a pMOS 372 (first current restricting active element), a pMOS 374, a nMOS 376, and a nMOS 378, and a second drive circuit 317 including an inverter 380, a pMOS 382 (second current restricting active element), a pMOS 384, a nMOS 386, a nMOS 388 and an OR circuit 390.

As can be clearly seen from comparison between FIG. 19 and FIG. 22, the write pulse drive circuit 313 is identical in configuration to the write pulse drive circuit 312 except that the second drive circuit 317 includes the OR circuit 390. Therefore, the common constituents will not be described repetitively.

The OR circuit 390 is an OR circuit which receives W0F and W1F as inputs and outputs a result of the OR operation to the inverter 380 and to the nMOS 388. In such a configuration, in both of the cases where W0F is H and W1F is L, and W0F is L and W1F is H, the second drive circuit 317 is turned ON (in a state where a pulse is input as /WEN). The first drive circuit 315 is tuned ON only when W0F is H and W1F is L. In such an operation, when the write data is "0," the first drive circuit 315 and the second drive circuit 317 are both driven and a sum of the current capacities of the first drive circuit 315 and the second drive circuit 317 becomes a current capacity of the write pulse drive circuit 313. On the other hand, when the write data is "1," only the second drive circuit 317 is driven, and the current capacity of the second drive circuit 317 becomes a current capacity of the write pulse drive circuit 313. Therefore, by setting the current capacity of the pMOS 372 to (Ia-Ib) and the current capacity of the pMOS 382 to Ib, the operation similar to that of Embodiment 3 is achieved. In this modification, the current capacity of the first drive circuit can be set smaller, and the write pulse drive circuit having a smaller area is attained.

For reference, table 1 shows a true value table in the case of using the write pulse drive circuit 312 of FIG. 19 and table 2 shows a true value table in the case of using the write pulse drive circuit 313 of FIG. 22.

TABLE 1

| | | Input of data input/output circuit | Output of data input/output circuit | Output of write data determiner circuit | | Output of electric power supply circuit | Output of write pulse drive circuit | |
|---|---|---|---|---|---|---|---|---|
| | | | | | | | First drive circuit | Second drive circuit |
| | | DIN | DINF | W0F | W1F | VOUT | | |
| Write | | 0 | 0 | 1 | 0 | V1 | Pulse generated | High Impedance |
| | | 1 | 1 | 0 | 1 | V2 | High Impedance | Pulse generated |
| Read | | High Impedance | | 0 | 1 | 0 | V1 | High Impedance | High Impedance |
| Stand-by | | High Impedance | | 0 | 1 or 0 | 0 | V1 or 0 V | High Impedance | High Impedance |

TABLE 2

| | Input of data input/output circuit DIN | Output of data input/output circuit DINF | Output of write data determiner circuit W0F | | Output of electric power supply circuit VOUT | Output of write pulse drive circuit | |
|---|---|---|---|---|---|---|---|
| | | | | W1F | | First drive circuit | Second drive circuit |
| Write | 0 | 0 | 1 | 0 | V1 | Pulse generated | Pulse generated |
| | 1 | 1 | 0 | 1 | V2 | High Impedance | Pulse generated |
| Read | High Impedance | 0 | 1 | 0 | V1 | High Impedance | High Impedance |
| Stand-by | High Impedance | 0 | 1 or 0 | 0 | V1 or 0 V | High Impedance | High Impedance |

[Modification 2]

Figure 23:
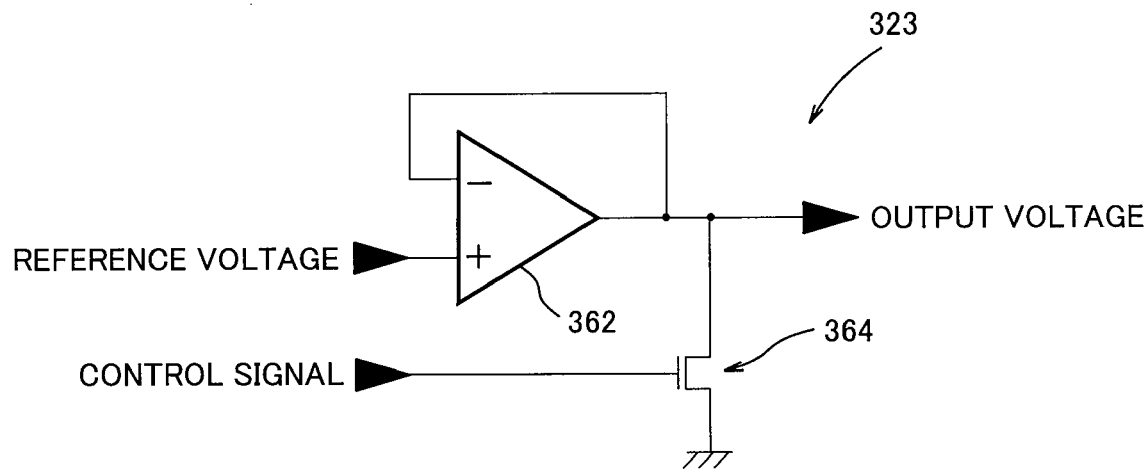
FIG. 23 is a circuit diagram showing an example of a specific configuration of a first electric power supply 323 in modification 2 of Embodiment 3 of the present invention.

As shown in FIG. 21, when writing to the memory cell MC12 transitions to writing to the memory cell MC21, VOUT gradually decreases. This is because a certain time is required to cause electric discharge from the word driver 332 side. However, when writing of "1" transitions to writing of "0," it sometimes happens that a decrease of VOUT is insufficient, and the electric potential of the word line becomes much higher than V1. In this case, it is necessary to decrease VOUT more positively. FIG. 23 is a circuit diagram showing an example of a specific configuration of the first electric power supply 323 according to Modification 2 of Embodiment 3 of the present invention. As shown in FIG. 23, the first electric power supply 322 includes an operational amplifier 362 and is configured such that the reference voltage (V1) is input to a plus input terminal of the operational amplifier 362 and the output voltage of the operational amplifier 362 is fed back to a minus input terminal thereof. Further, the output part of the voltage is electrically grounded via two main terminals of the transistor 364, and a control signal is input to the control terminal (gate) of the transistor 364. In such a configuration, by turning OFF the transistor 364, a constant voltage electric power supply using the reference voltage (V1) as an output voltage is implemented. On the other hand, by turning ON the transistor 364, the output voltage can be decreased rapidly. Therefore, when writing of "1" transitions to writing of "0," VOUT can be decreased rapidly. The second electric power supply 324 may have a similar configuration to that of the first electric power supply 322 except that the reference voltage is V2.

[Modification 3]

Figure 24:
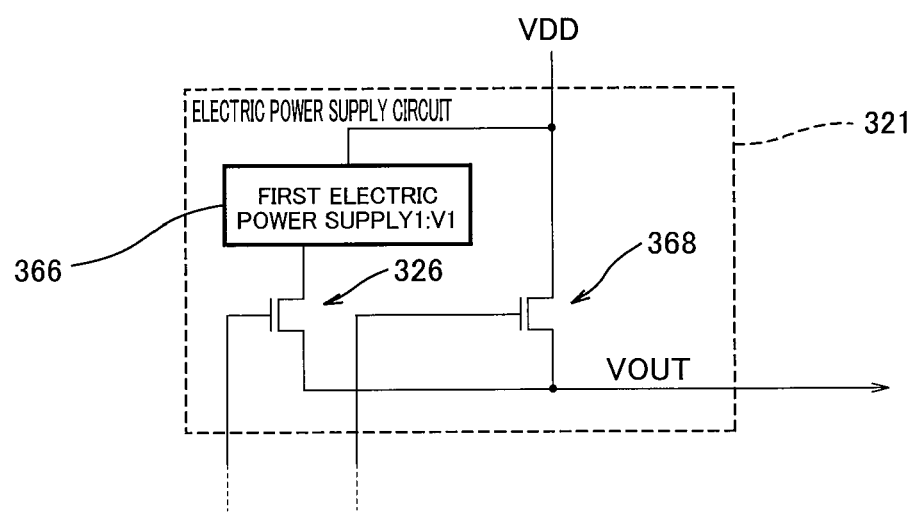
FIG. 24 is a circuit diagram showing an example of a specific configuration of an electric power supply circuit 321 in Modification 3 of Embodiment 3 of the present invention.
Figure 25:
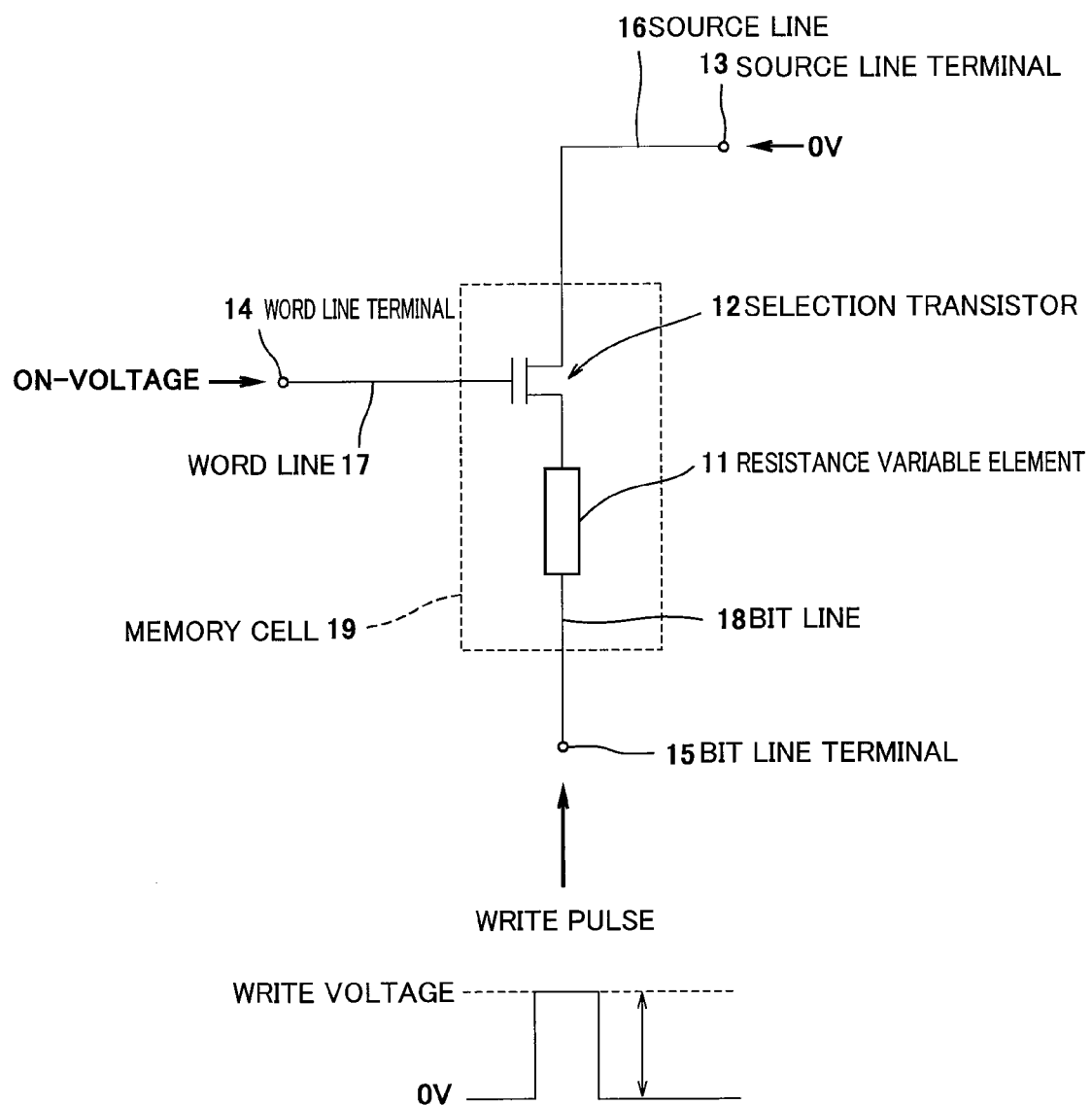
FIG. 25 is a view showing a state where an electric pulse is applied when a write operation is performed in a memory cell of Patent document 1.
Figure 26:
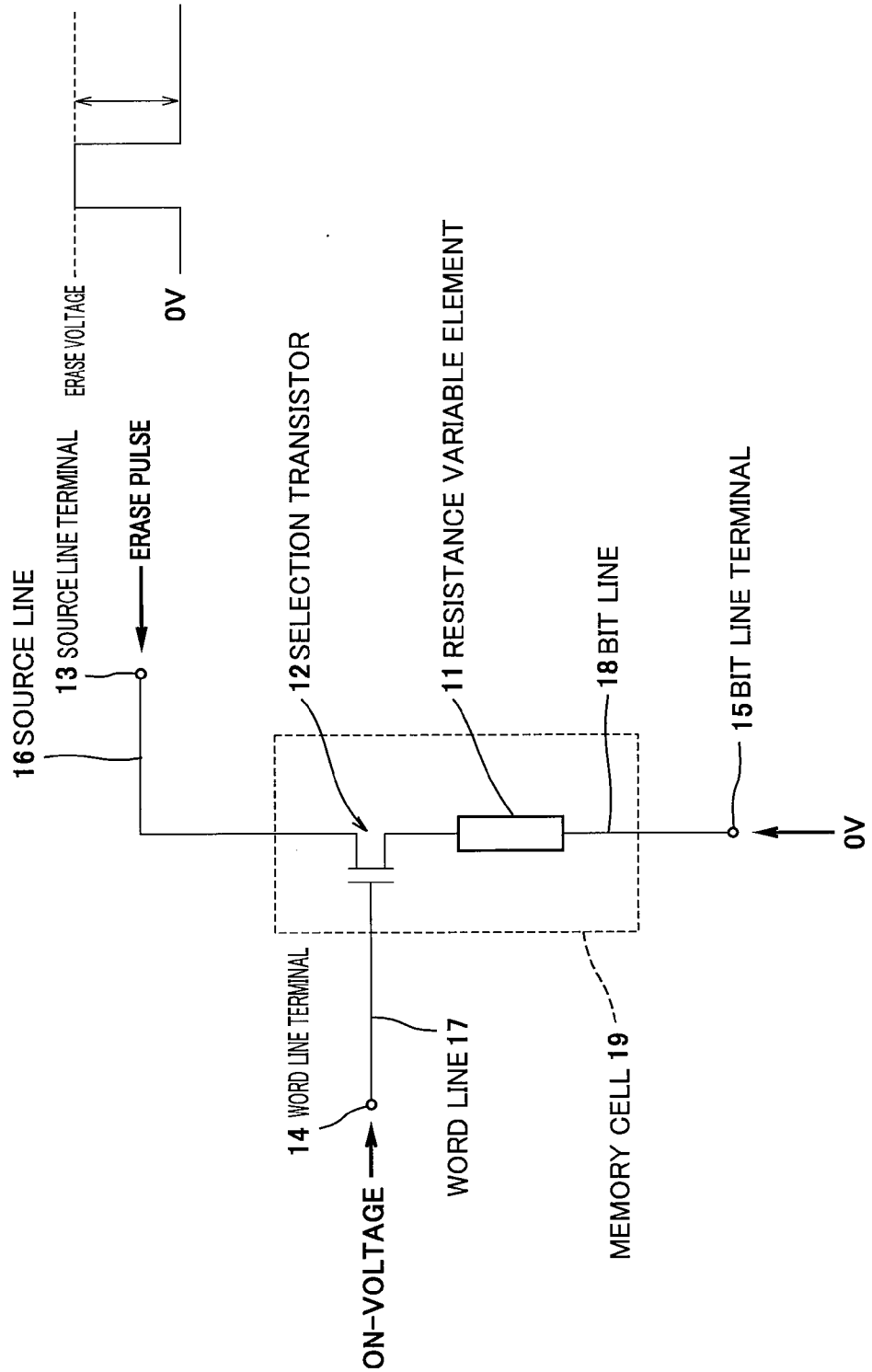
FIG. 26 is a view showing a state where an electric pulse is applied when an erase operation is performed in the memory cell of Patent document 1.
Figure 27:
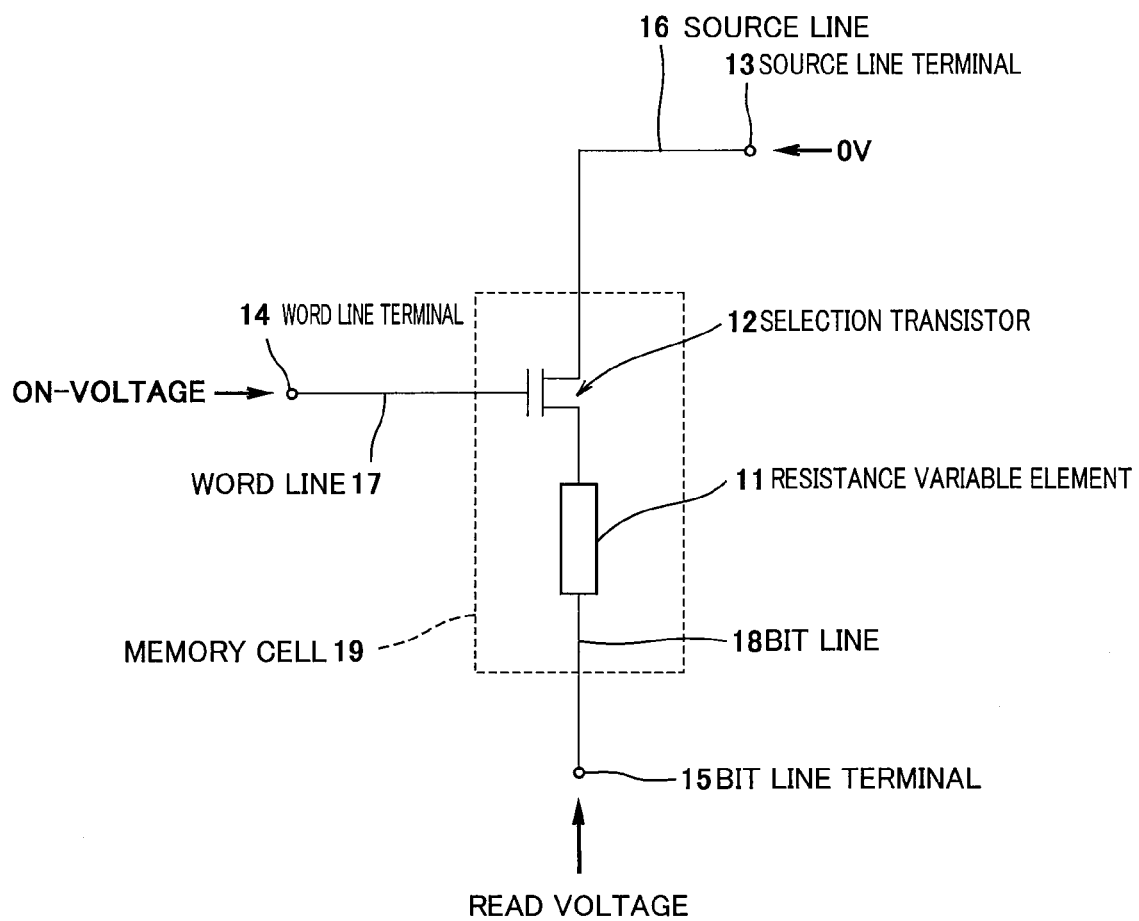
FIG. 27 is a view showing a state where an electric pulse is applied when a read operation is performed in the memory cell of Patent document 1.

FIG. 24 is a circuit diagram showing an example of a specific configuration of the electric power supply circuit 321 according to Modification 3 of Embodiment 3 of the present invention. The electric power supply circuit 321 of this modification is configured such that the second electric power supply 324 and the second transistor 328 are omitted from the electric power supply circuit 320 and an electric potential VDD (outside voltage) supplied from an external electric power supply via an external electric power supply input terminal 319 is connected to the output of the electric power supply circuit 320 via the two main terminals of the third transistor 368. In such a configuration, by turning ON the first transistor 326 and turning OFF the third transistor 368, V1 is output as VOUT, while by turning OFF the first transistor 326 and turning ON the third transistor 368, VDD is output as VOUT. This modification is a configuration of the electric power supply circuit in the case where the condition of the source electric potential (Vns) of the nMOS transistor serving as the voltage restricting active element is set as shown in FIG. 14.

[Other Modification]

Whereas in the above description, the electric power supply circuit is configured to selectively output V1 or V2 as VOUT which is input to the word driver, it may be configured to supply both V1 and V2 to the word driver and the word driver may be configured to select one of them inside thereof. In this case, W0F and W1F or the associated control signal are input to the word driver.

Whereas the electric power supply circuit is configured to switch V1 or V2 using the nMOS transfer gate, a configuration with a less electric potential drop may be provided using a CMOS transfer gate.

Writing to memory cells other than the above memory cells MC11 to MC22, may be performed in the same manner, as a matter of course. In general memory apparatuses, redundancy relief memory cells having the same shape as the memory cells of the base section for the purpose of faulty relief, or parity bits for error correction as a part of the memory array are added, although these are now shown. The memory cells and the parity bits can have a similar configuration and are operable in the same manner.

Vnt indicates the threshold voltage of the nMOS transistor of the memory cell. In some cases, the drain of the selection transistor of the selected memory cell does not reach a desired voltage at a desired timing, because of an electric potential drop derived from an electric resistance generated in a path from the electric power supply circuit to the word line via the word driver, or a delay time of the rising of the word line electric potential. In such cases, it is desired that the output voltages V1 and V2 of the electric power supply circuit be suitably controlled (e.g., set slightly higher) so that the voltage of the drain of the selection transistor of the selected memory cell actually reaches a desired voltage ((Va+Vnt) or higher when writing is performed to switch the element to the high-resistance state and ((Vb+Vnt) or higher when switching is performed to switch the element to the low-resistance state) at a desired timing. Needless to say, the selection transistor is not limited to the nMOS transistor but may be a pMOS transistor, etc.

The detailed description of the read operation is omitted. As the voltage applied in the read operation, V1 which is the output voltage of the electric power supply circuit may be used. When reading is performed with a lower electric power consumption, a low voltage electric power supply exclusive for reading may be provided and data may be read using the low voltage electric power supply.

The write data determiner circuit is not always essential. The data input/output circuit may be configured to determine the DIN signal and output W0F and W1F.

To attain a lower voltage, it is desired that the voltage VP of the write pulse drive circuit be transmitted to the bit line such that attenuation thereof is minimized. For this reason, a CMOS type column decoder or a voltage increasing type column decoder is desirably used. Likewise, the word driver desirably has a CMOS configuration so that the output voltage VOUT of the electric power supply circuit is transmitted to the word line such that attenuation thereof is minimized.

The substrate is desirably a silicon substrate.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable memory apparatus of the present invention is capable of surely preventing an incorrect operation or breakdown of an element when writing data with a simple configuration and using a resistance variable element which is switchable between plural resistance states in response to electric pulses which are identical in polarity, and is useful as a resistance variable memory apparatus for use with a variety of electronic hardware such as digital home appliance, memory cards, cellular phones, and personal computers.

The invention claimed is:

1. A resistance variable memory apparatus comprising:
a resistance variable element including a first electrode and a second electrode, the resistance variable element being configured to store data based on a change in an electric resistance between electrodes which is an electric resistance between the first electrode and the second electrode;
a controller;
a voltage restricting active element which is connected in series with the resistance variable element and is configured to set an upper limit of an absolute value of a voltage between electrodes which is an electric potential of the first electrode based on the second electrode as a reference to a predetermined value, in accordance with control of the controller; and
a current restricting active element which is connected in series with the resistance variable element via the voltage restricting active element and is configured to set an upper limit of an absolute value of a current between electrodes which is a current flowing between the first electrode and the second electrode to a predetermined value, in accordance with control of the controller; wherein
the resistance variable element has a characteristic in which,
in a state where the resistance variable element is in a low-resistance state in which the electric resistance between electrodes has a first resistance value, the resistance variable element is switched to a high-resistance state in which the electric resistance between electrodes has a second resistance value larger than the first resistance value when the voltage between electrodes exceeds in absolute value a first voltage,
while in a state where the resistance variable element is in the high-resistance state, the resistance variable element is switched from the high-resistance state to the low-resistance state when the voltage between electrodes exceeds in absolute value a second voltage which is identical in polarity to the first voltage and is larger in absolute value than the first voltage.

2. The resistance variable memory apparatus according to claim 1, further comprising: a substrate; a memory array; a column decoder; a row decoder; an electric power supply circuit; a write pulse drive circuit; and a controller;
wherein the memory array includes plural bit lines which belong to a first layer formed on the substrate and are formed to extend in parallel with each other; plural word lines which belong to a second layer formed on the substrate and are formed to extend in parallel with each other and to three-dimensionally cross the bit lines as viewed from a direction perpendicular to a main surface of the substrate; and resistance variable elements and voltage restricting active elements which are provided to respectively correspond to positions at which the bit lines and the word lines three-dimensionally cross as viewed from the direction perpendicular to the main surface of the substrate;
wherein the voltage restricting active element is a field effect transistor having a first main terminal, a second main terminal, and a control terminal, the second main terminal is connected to the first electrode, the first main terminal is connected to the bit line, and the control terminal is connected to the word line;
wherein the column decoder is configured to select a specified bit line in accordance with control of the controller;
wherein the row decoder is configured to select a specified word line in accordance with control of the controller;
wherein the electric power supply circuit is configured to selectively output a fifth voltage or a sixth voltage to the selected word line in accordance with control of the controller;
wherein the current restricting active element includes a first current restricting active element having a first current capacity and a second current restricting active element having a second current capacity different from the first current capacity;
wherein the write pulse drive circuit includes the first current restricting active element and the second current restricting active element and is configured to output an electric pulse to the selected bit line via one of the first current restricting active element and the second current restricting active element which is selected in accordance with control of the controller;
wherein when a voltage which is lower than the fifth voltage by a threshold voltage of the voltage restricting active element is a third voltage and a voltage which is lower than the sixth voltage by a threshold voltage of the voltage restricting active element is a fourth voltage, a relationship is established such that the first voltage<the third voltage<the second voltage and the second voltage<the fourth voltage;
wherein the controller is configured to control the column decoder and the row decoder to select a resistance variable element corresponding to a cross point between a specified bit line and a specified word line;
wherein the controller is configured to control the write pulse drive circuit so as to output an electric pulse to the selected bit line via the first current restricting active element and to control the electric power supply circuit so as to output the fifth voltage to the selected word line when the selected resistance variable element is switched to the high-resistance state;

and wherein the controller is configured to control the write pulse drive circuit so as to output an electric pulse to the selected bit line via the second current restricting active element and to control the electric power supply circuit so as to output the sixth voltage to the selected word line when the selected resistance variable element is switched to the low-resistance state.

3. The resistance variable memory apparatus according to claim 2, wherein the third voltage is set to a value at which the voltage between electrodes of the selected resistance variable element becomes not smaller than the first voltage in a state where the selected resistance variable element is in the low-resistance state.

4. The resistance variable memory apparatus according to claim 2, wherein the fourth voltage is not smaller than a voltage which is obtained by adding to the second voltage a threshold voltage of a field effect transistor which is the voltage restricting active element.

5. The resistance variable memory apparatus according to claim 2, further comprising:
an external electric power supply input terminal for receiving an input of an outside voltage from an external electric power supply;
wherein the electric power supply circuit is configured to output, as the fourth voltage, the outside voltage input to the external electric power supply input terminal.

6. The resistance variable memory apparatus according to claim 2, wherein the first current capacity has a value at which a product of the value of the first current capacity and the first resistance value becomes not smaller than the first voltage.

7. The resistance variable memory apparatus according to claim 2, wherein the second current capacity has a value at which a product of the value of the second current capacity and the second resistance value becomes not smaller than the second voltage and a product of the value of the second current capacity and the first resistance value becomes smaller than the first voltage.

8. The resistance variable memory apparatus according to claim 2, being configured to rewrite the resistance state of the resistance variable memory apparatus plural times.

9. The resistance variable memory apparatus according to claim 1, wherein
the controller is configured to control the current restricting active element so that an absolute value of a product of the current between electrodes and the first resistance value becomes not smaller than the first voltage and to control the voltage restricting active element so that an absolute value of the voltage between electrodes becomes smaller than the second voltage, when the resistance variable element is switched from the low-resistance state to the high-resistance state; and wherein
the controller is configured to control the current restricting active element so that an absolute value of a product of the current between electrodes and the second resistance value becomes not smaller than the second voltage and an absolute value of a product of the current between electrodes and the first resistance value becomes smaller than the first voltage, when the resistance variable element is switched from the high-resistance state to the low-resistance state.

10. The resistance variable memory apparatus according to claim 1, being configured such that a ratio of the second voltage to the first voltage is smaller than a ratio of the second resistance value to the first resistance value.

11. The resistance variable memory apparatus according to claim 1, wherein
the voltage restricting active element is a field effect transistor;
wherein one of a source and a drain of the voltage restricting active element is connected to the resistance variable element; and
wherein the controller is configured to control an electric potential of a gate terminal of the voltage restricting active element to restrict an electric potential of the source or the drain which is connected to the resistance variable element so that the upper limit of the absolute value of the voltage between electrodes is set to the predetermined value.

12. The resistance variable memory apparatus according to claim 1, wherein
the current restricting active element is a field effect transistor;
wherein one of a source and a drain of the current restricting active element is electrically connected to the resistance variable element; and
wherein the controller is configured to control an electric potential of a gate terminal of the current restricting active element to restrict a current flowing between the source and the drain so that the upper limit of the absolute value of the current between electrodes is set to the predetermined value.

13. The resistance variable memory apparatus according to claim 1, further comprising:
an electric pulse application device including a first output terminal and a second output terminal, the electric pulse application device being configured to output an electric pulse between the first output terminal and the second output terminal;
a reference node;
a series current path configured to electrically connect the first output terminal to the reference node;
a resistance variable current path including the resistance variable element, the resistance variable current path being configured to electrically connect the reference node to the second output terminal via the resistance variable element; and
a parallel current path configured to electrically connect the reference node to the second output terminal in parallel with the resistance variable current path;
wherein an electric resistance of the series current path, an electric resistance of the parallel current path, an electric resistance of the resistance variable current path in a state where the resistance variable element is in the high-resistance state, and an electric resistance of the resistance variable current path in a state where the resistance variable element is in the low high-resistance state, are set to values so that an electric potential of the reference node becomes not smaller in absolute value than the second voltage when the electric pulse application device is outputting the electric pulse in a state where the resistance variable element is in the high-resistance state, while the electric potential of the reference node becomes smaller in absolute value than the first voltage even when the electric pulse application device is outputting the electric pulse after the resistance variable element has been switched to the low-resistance state.

* * * * *